US011961864B2

(12) United States Patent
Yoshida

(10) Patent No.: US 11,961,864 B2
(45) Date of Patent: Apr. 16, 2024

(54) IMAGING DEVICE WITH IMPROVED LAYOUT OF READING CIRCUIT TRANSISTORS

(71) Applicant: SONY SEMICONDUCTOR SOLUTIONS CORPORATION, Kanagawa (JP)

(72) Inventor: Shinichi Yoshida, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 173 days.

(21) Appl. No.: 17/601,563

(22) PCT Filed: Apr. 24, 2020

(86) PCT No.: PCT/JP2020/017677
§ 371 (c)(1),
(2) Date: Oct. 5, 2021

(87) PCT Pub. No.: WO2020/218503
PCT Pub. Date: Oct. 29, 2020

(65) Prior Publication Data
US 2022/0208823 A1 Jun. 30, 2022

(30) Foreign Application Priority Data
Apr. 25, 2019 (JP) ................ 2019-084191

(51) Int. Cl.
H01L 27/146 (2006.01)
H01L 23/00 (2006.01)
(Continued)

(52) U.S. Cl.
CPC .. H01L 27/14634 (2013.01); H01L 27/14689 (2013.01); H01L 27/1469 (2013.01);
(Continued)

(58) Field of Classification Search
CPC ......... H01L 27/14634; H01L 27/14689; H01L 27/1469; H01L 24/08; H01L 24/29;
(Continued)

(56) References Cited

U.S. PATENT DOCUMENTS

2014/0042298 A1* 2/2014 Wan ............... H01L 27/1469
257/E31.127
2016/0118425 A1 4/2016 Kurokawa
(Continued)

FOREIGN PATENT DOCUMENTS

JP 2010-245506 10/2010
JP 2016-086164 5/2016
(Continued)

OTHER PUBLICATIONS

International Search Report prepared by the Japan Patent Office dated Jul. 13, 2020, for International Application No. PCT/JP2020/017677, 2 pgs.

Primary Examiner — Padma Haliyur
(74) Attorney, Agent, or Firm — Sheridan Ross PC

(57) ABSTRACT

Provided is an imaging device in which the degree of freedom in the layout can be improved. The imaging device includes a first substrate part that includes a sensor pixel to perform photoelectric conversion, and a second substrate part that is disposed on one surface side of the first substrate part and that includes a reading circuit to output a pixel signal based on an electric charge outputted from the sensor pixel. The second substrate part includes a first semiconductor substrate on which a first transistor included in the reading circuit is disposed, and a second semiconductor substrate which is disposed on one surface side of the first semiconductor substrate and on which a second transistor included in the reading circuit is disposed.

20 Claims, 24 Drawing Sheets

(51) Int. Cl.
  *H04N 25/75*     (2023.01)
  *H04N 25/77*     (2023.01)
  *H04N 25/79*     (2023.01)
(52) U.S. Cl.
  CPC ............. *H04N 25/75* (2023.01); *H04N 25/77* (2023.01); *H04N 25/79* (2023.01); *H01L 24/08* (2013.01); *H01L 24/29* (2013.01); *H01L 24/32* (2013.01); *H01L 24/33* (2013.01); *H01L 24/80* (2013.01); *H01L 24/83* (2013.01); *H01L 27/14636* (2013.01); *H01L 27/14645* (2013.01); *H01L 2224/08145* (2013.01); *H01L 2224/29186* (2013.01); *H01L 2224/32145* (2013.01); *H01L 2224/33181* (2013.01); *H01L 2224/80379* (2013.01); *H01L 2224/8089* (2013.01); *H01L 2224/8389* (2013.01)
(58) Field of Classification Search
  CPC ......... H01L 24/32; H01L 24/33; H01L 24/80; H01L 24/83; H01L 27/14636; H01L 27/14645; H01L 2224/08145; H01L 2224/29186; H01L 2224/32145; H01L 2224/33181; H01L 2224/80379; H01L 2224/8089; H01L 2224/8389; H01L 2224/80097; H01L 2224/80357; H01L 2224/80895; H01L 2224/80896; H01L 2224/80906; H01L 2224/80948; H01L 21/3205; H01L 21/768; H01L 23/522; H01L 27/146; H01L 27/14612; H04N 25/75; H04N 25/77; H04N 25/79; H04N 25/76

See application file for complete search history.

(56) References Cited

U.S. PATENT DOCUMENTS

| | | | |
|---|---|---|---|
| 2016/0225806 A1* | 8/2016 | Tatani | H01L 27/1461 |
| 2017/0062501 A1* | 3/2017 | Velichko | H01L 27/14641 |
| 2018/0358393 A1 | 12/2018 | Sato et al. | |
| 2019/0297292 A1* | 9/2019 | Hynecek | H04N 25/57 |
| 2020/0366860 A1* | 11/2020 | Shishido | H01L 27/14612 |

FOREIGN PATENT DOCUMENTS

| | | |
|---|---|---|
| JP | 2018-148116 | 9/2018 |
| JP | 2019-004001 | 1/2019 |

* cited by examiner

IMAGING DEVICE WITH IMPROVED LAYOUT OF READING CIRCUIT TRANSISTORS

CROSS REFERENCE TO RELATED APPLICATIONS

This application is a national stage application under 35 U.S.C. 371 and claims the benefit of PCT Application No. PCT/JP2020/017677 having an international filing date of 24 Apr. 2020, which designated the United States, which PCT application claimed the benefit of Japanese Patent Application No. 2019-084191 filed 25 Apr. 2019, the entire disclosures of each of which are incorporated herein by reference.

TECHNICAL FIELD

The present disclosure relates to an imaging device.

BACKGROUND ART

Conventionally, in an imaging device having a two-dimensional structure, the area of each pixel has been reduced as a result of the introduction of a miniaturization process and improvement of mounting density. In recent years, in order to downsize an imaging device and to increase the density of pixels, an imaging device having a three-dimensional structure has been developed (for example, see PTL 1). An imaging device having a three-dimensional structure includes a first semiconductor substrate that includes a plurality of sensor pixels, and a second semiconductor substrate that includes a reading circuit to read signals obtained by the sensor pixels. On one surface side of the first semiconductor substrate, the second semiconductor substrate is layered.

CITATION LIST

Patent Literature

[PTL 1]
Japanese Patent Laid-Open No. 2010-245506

SUMMARY

Technical Problem

A reading circuit includes a selection transistor that selects a sensor pixel, an amplification transistor that amplifies a signal obtained by the sensor pixel, a reset transistor that resets the signal obtained by the sensor pixel, and the like. The arrangement and the sizes (hereinafter, layout) of the transistors included in the reading circuit have an influence on the performance of the imaging device. For example, when the gate area in the amplification transistor is set to be small, the noise characteristics of the imaging device may be deteriorated. For this reason, improvement of the degree of freedom in the layout has been required.

The present disclosure has been made in view of the above circumstances, and an object thereof is to provide an imaging device in which the degree of freedom in the layout can be improved.

Solution to Problem

An imaging device according to one aspect of the present disclosure includes a first substrate part that includes a sensor pixel to perform photoelectric conversion, and a second substrate part that is disposed on one surface side of the first substrate part and that includes a reading circuit to output a pixel signal based on an electric charge outputted from the sensor pixel. The second substrate part includes a first semiconductor substrate on which a first transistor included in the reading circuit is disposed, and a second semiconductor substrate that is disposed on one surface side of the first semiconductor substrate and on which a second transistor included in the reading circuit is disposed.

Accordingly, the area of the arrangement region of the transistors can be increased, compared to a case where all the transistors included in the reading circuit are disposed on a single semiconductor substrate. Therefore, the degree of freedom in the layout on the reading circuit can be improved. For example, an amplification transistor can be disposed on the first semiconductor substrate while a selection transistor and a reset transistor can be disposed on the second semiconductor substrate. As a result, the gate area in the amplification transistor can be maximized.

An imaging device according to another aspect of the present disclosure includes a first substrate part that includes a sensor pixel to perform photoelectric conversion, and a second substrate part that is disposed on one surface side of the first substrate part and that includes a reading circuit to output a pixel signal based on an electric charge outputted from the sensor pixel. The second substrate part includes a first semiconductor substrate on which a first transistor included in the reading circuit is disposed, and a semiconductor film that is disposed on one surface side of the first semiconductor substrate and on which a second transistor included in the reading circuit is disposed.

Accordingly, the area of the arrangement region of the transistors can be increased, compared to a case where all the transistors included in a reading circuit are disposed only on a surface of a substrate. Therefore, the degree of freedom in the layout on the reading circuit can be improved. For example, an amplification transistor can be disposed on the first semiconductor substrate while a selection transistor and a reset transistor can be disposed on the semiconductor film layered on the first semiconductor substrate. As a result, the gate area in the amplification transistor can be maximized.

DESCRIPTION OF EMBODIMENTS

Figure 1:
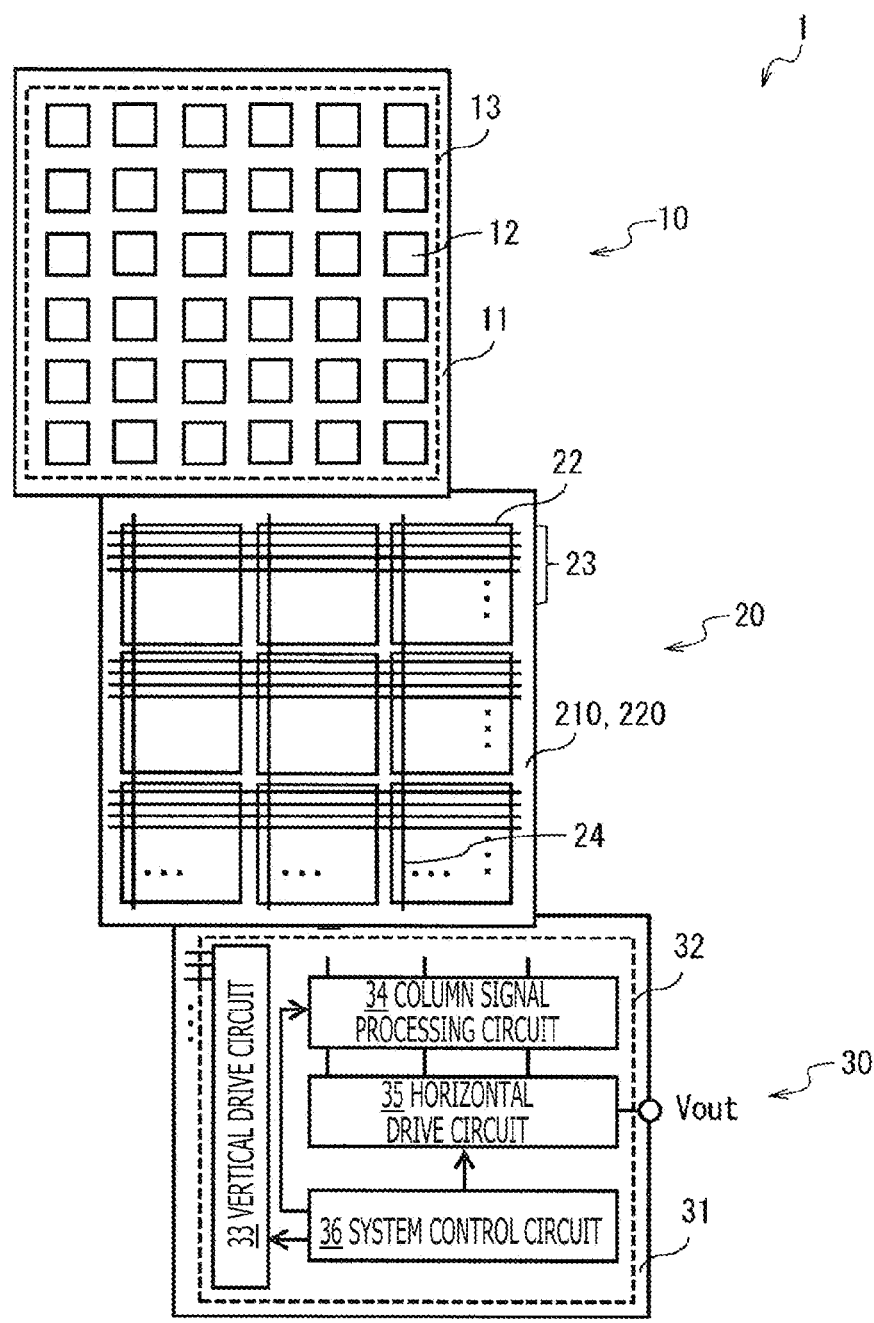
FIG. 1 is a schematic diagram depicting a configuration example of an imaging device according to a first embodiment of the present disclosure.

Hereinafter, embodiments according to the present disclosure will be explained with reference to the drawings. Regarding illustration in the drawings to which reference will be made in the following explanation, identical or similar components are denoted by identical or similar reference signs. However, it should be noted that the relation between a thickness and a planar dimension, a thickness ratio between layers, etc. depicted in the drawings are different from actual ones because the drawings are schematic. Accordingly, a specific thickness or a specific dimension should be determined in view of the following explanation. Moreover, it goes without saying that the dimensional relation or the ratio differs among the drawings.

In addition, the definitions of directions such as upward and downward directions in the following explanation are simply given for convenience of explanation. These definitions are not intended to delimit the technical idea of the present disclosure. For example, it goes without saying that, when a target is observed after being rotated by 90 degrees, the upper and lower sides thereof are read as the left and right sides, and, when a target is observed after being rotated by 180 degrees, the upper and lower sides thereof are read as being inverted.

Further, in the following explanation, the terms "X-axis direction," "Y-axis direction," and "Z-axis direction" are used to explain directions in some cases. For example, the Z-axis direction refers to a thickness direction of a layered body including a first substrate part 10 and a second substrate part 20, which will be explained later. The X-axis direction and the Y-axis direction are each orthogonal to the Z-axis direction. The X-axis direction, the Y-axis direction, and the Z-axis direction are orthogonal to one another. In the following explanation, a direction that is parallel with the X-axis direction and the Y-axis direction is also referred to as a horizontal direction. In addition, in the following explanation, the term "plan view" refers to seeing from the Z-axis direction.

First Embodiment

FIG. 1 is a schematic diagram depicting a configuration example of an imaging device 1 according to a first embodiment of the present disclosure. The imaging device 1 includes a first substrate part 10, a second substrate part 20, and a third substrate part 30. The imaging device 1 is an imaging device having a three-dimensional structure formed by bonding the first substrate part 10, the second substrate part 20, and the third substrate part 30 together. The first substrate part 10, the second substrate part 20, and the third substrate part 30 are layered in this order.

The first substrate part 10 includes, on a semiconductor substrate 11, a plurality of sensor pixels 12 to perform photoelectric conversion. The plurality of sensor pixels 12 is disposed in a matrix shape in a pixel region 13 in the first substrate part 10. The second substrate part 20 includes reading circuits 22 to output pixel signals based on electric charges from the sensor pixels 12. Each of the reading circuits 22 is provided for every four sensor pixels 12. The second substrate part 20 includes a plurality of pixel drive lines 23 extending in a row direction and a plurality of vertical signal lines 24 extending in a column direction. It is to be noted that the third substrate part 30 may also be referred to as a bottom substrate.

The second substrate part 20 has a structure in which two substrates are layered, as described later. The second substrate part 20 includes a lower substrate 210 and an upper substrate 220. The lower substrate 210 includes a first semiconductor substrate 211 (see FIG. 3). The upper substrate 220 includes a second semiconductor substrate 221 (see FIG. 3). A first transistor included in the reading circuit 22 is disposed on the first semiconductor substrate 211. A second transistor included in the reading circuit 22 is disposed on the second semiconductor substrate 221. It is to be noted that the upper substrate 220 may also be referred to as a top substrate. The lower substrate 210 may also be referred to as a middle substrate.

The third substrate part 30 includes, on a semiconductor substrate 301, a logic circuit 32 to process pixel signals. The logic circuit 32 includes a vertical drive circuit 33, a column signal processing circuit 34, a horizontal drive circuit 35, and a system control circuit 36, for example. The logic circuit 32 (or specifically, the horizontal drive circuit 35) outputs an output voltage Vout of each sensor pixel 12 to the outside. In the logic circuit 32, a low resistance region including a silicide, which is formed by a salicide (Self Aligned Silicide) process using $CoSi_2$, NiSi, or the like, may be formed on a surface of an impurity diffusion region that is in contact with a source electrode and a drain electrode, for example.

For example, the vertical drive circuit 33 sequentially selects the plurality of sensor pixels 12 by row units. For example, the column signal processing circuit 34 performs Correlated Double Sampling (CDS) on pixel signals outputted from the sensor pixels 12 included in a row selected by the vertical drive circuit 33. For example, by performing CDS, the column signal processing circuit 34 extracts signal levels of the pixel signals and holds pixel data corresponding to the light reception amounts of the respective sensor pixels 12. For example, the horizontal drive circuit 35 sequentially outputs the pixel data held by the column signal processing circuit 34 to the outside. The system control circuit 36 performs drive control of the blocks (the vertical drive circuit 33, the column signal processing circuit 34, and the horizontal drive circuit 35) included in the logic circuit 32, for example.

Figure 2:
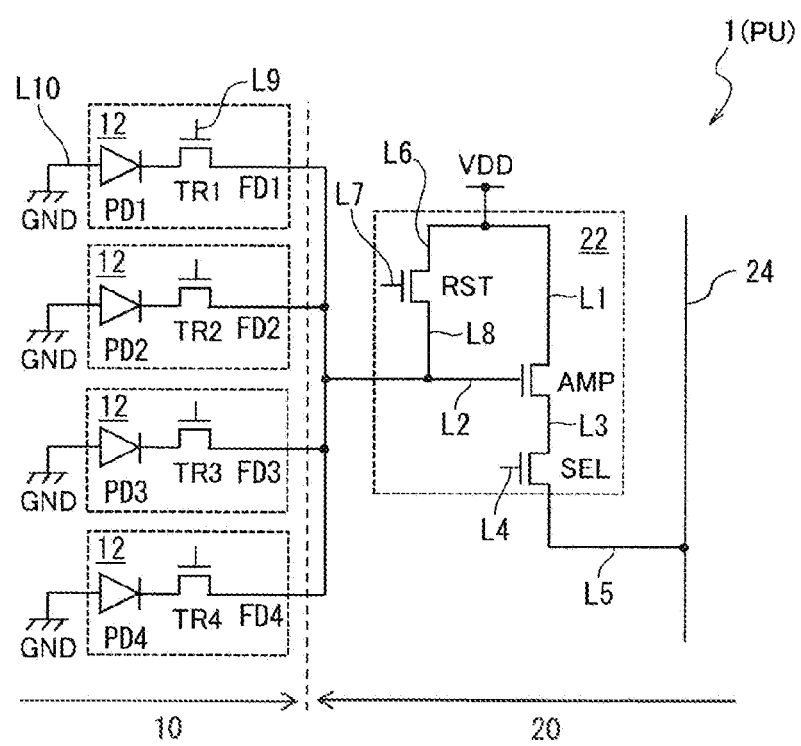
FIG. 2 is a circuit diagram depicting a configuration example of a pixel unit according to the first embodiment of the present disclosure.

FIG. 2 is a circuit diagram depicting a configuration example of a pixel unit PU according to the first embodiment of the present disclosure. As depicted in FIG. 2, in the imaging device 1, four sensor pixels 12 are electrically connected to one reading circuit 22, whereby one pixel unit PU is formed. The four sensor pixels 12 share the one reading circuit 22. Outputs from the four sensor pixels 12 are inputted to the common reading circuit 22.

Each sensor pixel 12 has the same components. In order to make components of the sensor pixels 12 distinguishable from one another in FIG. 2, an identification number (1, 2, 3, or 4) is given after a reference character (e.g. PD, TG, or FD, which will be described later) for a component of each sensor pixel 12. Hereinafter, in a case where the components of the respective sensor pixels 12 need to be distinguished from one another, the corresponding identification numbers will be given after the reference characters for the components of the sensor pixels 12, but, in a case where the components of the respective sensor pixels 12 do not need to be distinguished from one another, the identification numbers will be omitted after the reference characters for the components of the sensor pixels 12.

Each sensor pixel 12 includes a photodiode PD (which is one example of a photoelectric conversion element), a transfer transistor TR that is electrically connected to the photodiode PD, and a floating diffusion FD that temporarily holds an electric charge outputted from the photodiode PD via the transfer transistor TR, for example. The photodiode PD performs photoelectric conversion and generates an electric charge according to the light reception amount. A cathode of the photodiode PD is electrically connected to a source of the transfer transistor TR, and an anode of the photodiode PD is electrically connected to a reference potential line (e.g. the ground). A drain of the transfer transistor TR is electrically connected to the floating diffusion FD, and a gate electrode of the transfer transistor TR is electrically connected to the pixel drive line 23. For example, the transfer transistor TR is a CMOS (Complementary Metal Oxide Semiconductor) transistor.

The respective floating diffusions FD of the sensor pixels 12 that share one reading circuit 22 are electrically connected to one another and are electrically connected to an input end of the common reading circuit 22. For example, each reading circuit 22 includes an amplification transistor AMP (which is one example of the first transistor), a reset transistor RST, and a selection transistor SEL (which are examples of the second transistors). It is to be noted that the selection transistor SEL may be omitted as appropriate.

A source of the reset transistor RST (the input end of the reading circuit 22) is electrically connected to the floating diffusions FD, and a drain of the reset transistor RST is electrically connected to a power supply line VDD and a drain of the amplification transistor AMP. A gate electrode of the reset transistor RST is electrically connected to the pixel drive line 23 (see FIG. 1). A source of the amplification transistor AMP is electrically connected to a drain of the selection transistor SEL, and a gate electrode of the amplification transistor AMP is electrically connected to the source of the reset transistor RST. A source of the selection transistor SEL (an output end of the reading circuit 22) is electrically connected to the vertical signal line 24, and a gate electrode of the selection transistor SEL is electrically connected to the pixel drive line 23 (see FIG.

Figure 3:
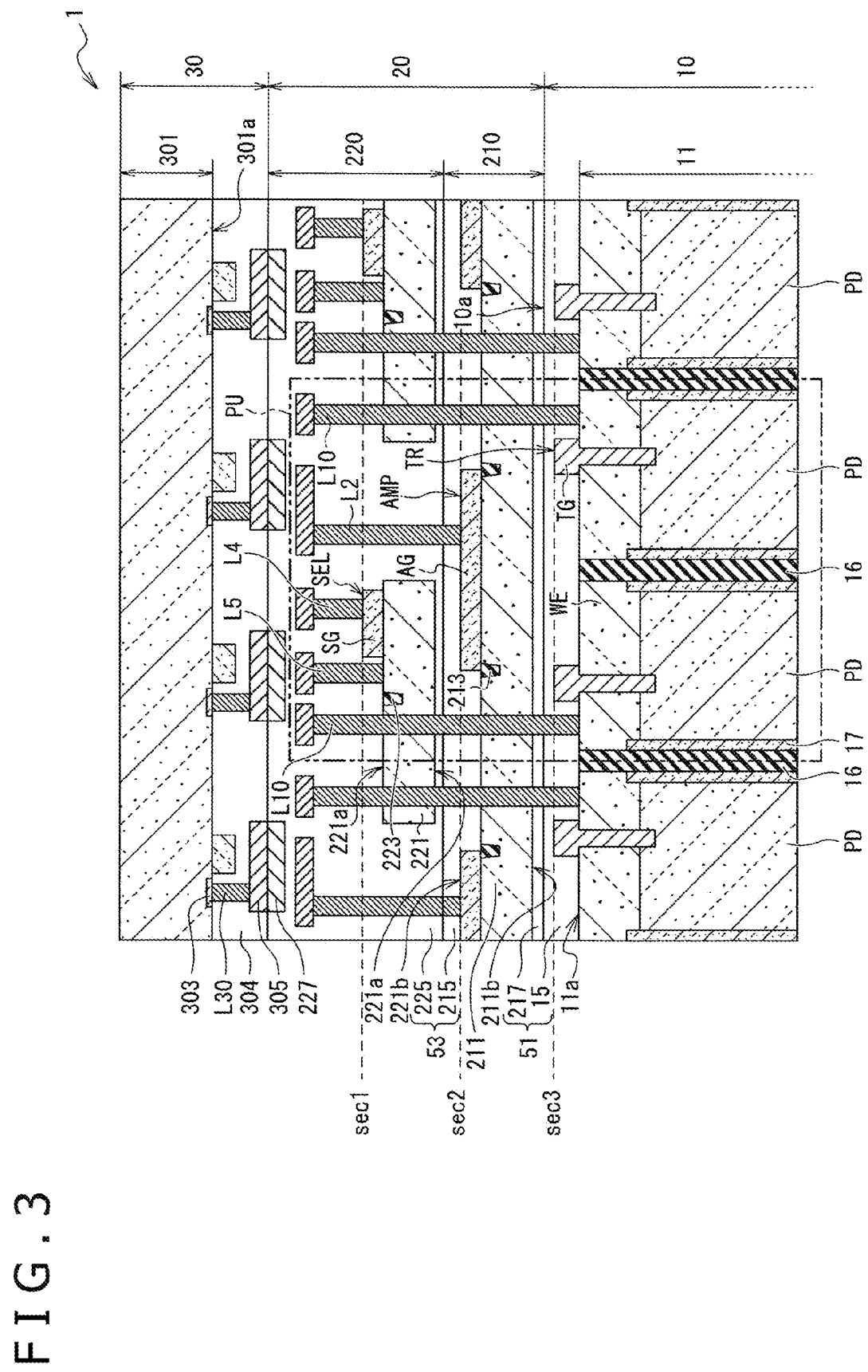
FIG. 3 is a cross sectional view in a thickness direction of a configuration example of an imaging device 1 according to the first embodiment of the present disclosure.

When the transfer transistor TR is turned on, the transfer transistor TR transfers an electric charge in the photodiode PD to the floating diffusion FD. A gate electrode TG of the transfer transistor TR is extended to such a depth as to reach the photodiode PD from a surface of the semiconductor substrate 11 through a well layer WE, as illustrated in FIG. 3, which will be explained later. The reset transistor RST resets the potential of each floating diffusion FD to a predetermined potential. When the reset transistor RST is turned on, the potential of each floating diffusion FD is reset to the potential of the power supply line VDD. The selection transistor SEL controls a timing of outputting a pixel signal from the reading circuit 22.

The amplification transistor AMP generates, as a pixel signal, a signal having a voltage according to the level of the electric charge held in each floating diffusion FD. The amplification transistor AMP forms a source follower type amplifier and is configured to output a pixel signal having a voltage according to the level of the electric charge generated by each photodiode PD. When the selection transistor SEL is turned on, the amplification transistor AMP amplifies the potential of each floating diffusion FD and outputs a voltage according to the potential to the column signal processing circuit 34 via the vertical signal line 24. The reset transistor RST, the amplification transistor AMP, and the selection transistor SEL are CMOS transistors, for example.

Figure 4A:
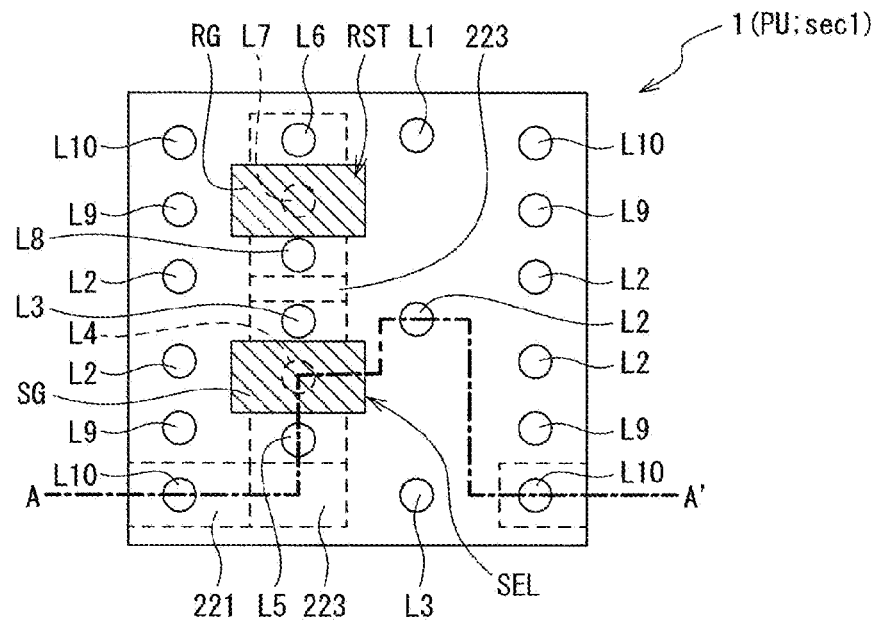
FIG. 4A is a cross sectional view in a horizontal direction of a configuration example of the pixel unit according to the first embodiment of the present disclosure.
Figure 4B:
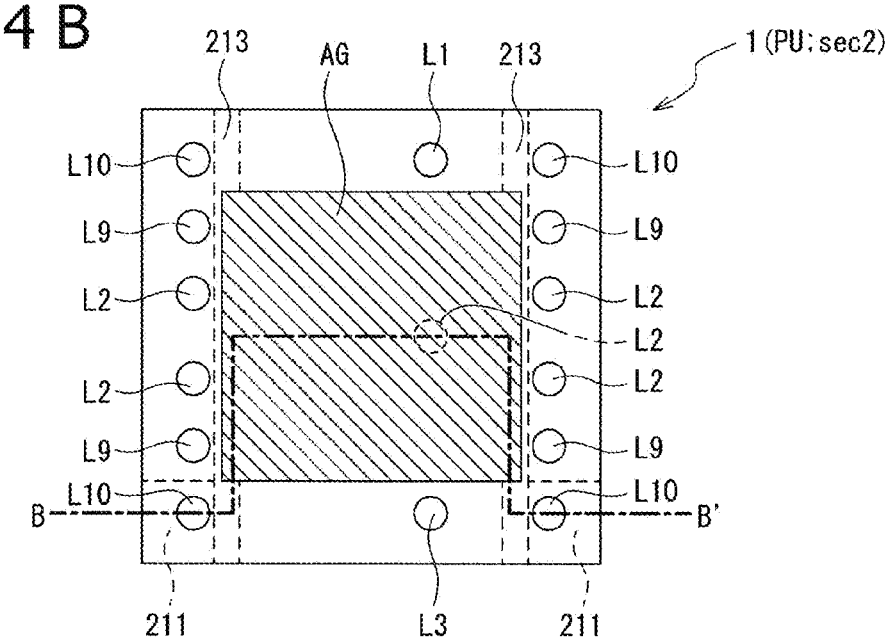
FIG. 4B is a cross sectional view in the horizontal direction of the configuration example of the pixel unit according to the first embodiment of the present disclosure.
Figure 4C:
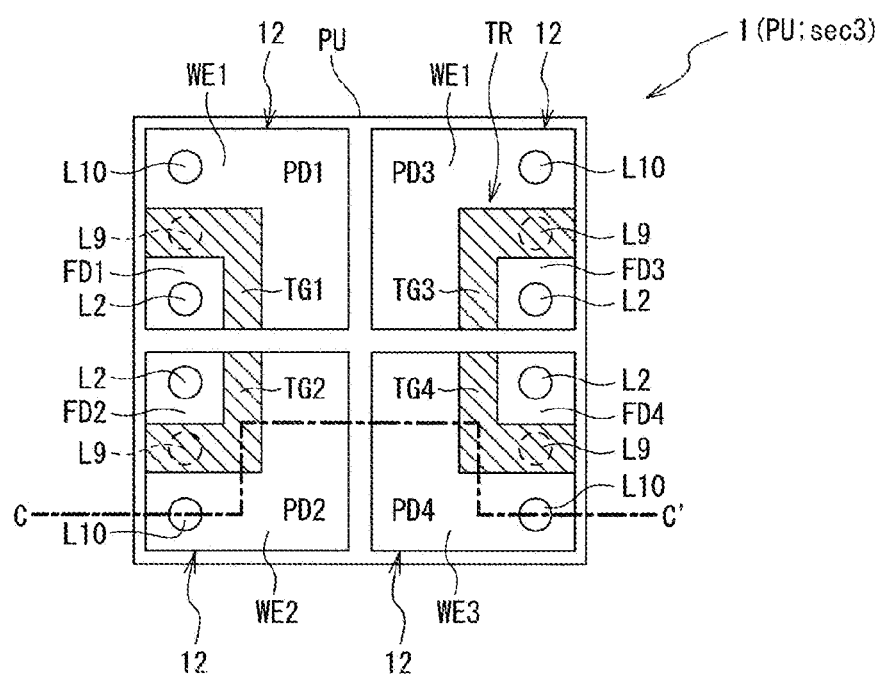
FIG. 4C is a cross sectional view in the horizontal direction of the configuration example of the pixel unit according to the first embodiment of the present disclosure.

FIG. 3 is a cross sectional view in the thickness direction of a configuration example of the imaging device 1 according to the first embodiment of the present disclosure. It is to be noted that the cross sectional view in FIG. 3 is schematic and is not intended to precisely depict an actual structure. In order to explain the configuration of the imaging device 1 in an easy-to-understand manner on paper, positions in the horizontal direction of transistors and impurity diffusion layers are intentionally changed among positions sec1 to sec3 in the cross sectional view in FIG. 3. Specifically, a cross section of the pixel unit PU at the position sec1 in FIG. 3 corresponds to a cross section taken along line A-A' in FIG. 4A, which will be explained later. A cross section of the pixel unit PU at the position sec2 in FIG. 3 corresponds to a cross section taken along line B-B' in FIG. 4B, which will be explained later. A cross section of the pixel unit PU at the position sec3 in FIG. 3 corresponds to a cross section taken along line C-C' in FIG. 4C, which will be explained later. The structures of the imaging device 1 depicted in FIGS. 4A to 4C are more accurate than that depicted in FIG. 3.

As depicted in FIG. 3, the second substrate part 20 is layered on a front surface 10a (which is one example of one surface) side of the first substrate part (bottom substrate) 10. The photodiode PD, the transfer transistor TR, and the floating diffusion FD are disposed on the front surface 10a side of the first substrate part 10. The photodiode PD, the transfer transistor TR, and the floating diffusion FD are provided for each sensor pixel 12.

The other surface (e.g. rear surface) of the first substrate part 10 is a light incident surface. The imaging device 1 is a rear-surface illumination type imaging device and has color filters and light receiving lenses disposed on the rear surface thereof. The color filters and light receiving lenses are disposed for the respective sensor pixels 12.

The semiconductor substrate 11 included in the first substrate part 10 includes a silicon substrate, for example. A first conductive type (e.g. p type) well layer WE is disposed on a portion of a front surface of the semiconductor substrate 11 and the vicinity thereof. A second conductive type (e.g. n type) photodiode PD is disposed in a region deeper than the well layer WE. Further, a well contact layer having a higher p-type concentration than the well layer WE, and the floating diffusion FD (see FIG. 2) that is the n type are disposed in the well layer WE. The well contact layer is disposed in order to reduce the contact resistance between the well layer WE and the lines.

An element isolation layer 16 that electrically isolates the adjacent sensor pixels 12 from each other is disposed in the semiconductor substrate 11. The element isolation layer 16 has an STI (Shallow Trench Isolation) structure, for example, and is extended in a depth direction of the semiconductor substrate 11. The element isolation layer 16 includes silicon oxide, for example. In addition, in the semiconductor substrate 11, an impurity diffusion layer 17 is disposed between the element isolation layer 16 and the photodiode PD. For example, the impurity diffusion layer 17 includes a p-type layer and an n-type layer that are extended in the thickness direction of the semiconductor substrate 11. The p-type layer is located on the element isolation layer 16 side. The n-type layer is located on the photodiode PD side.

An insulation film 15 is disposed on a front surface 11a side of the semiconductor substrate 11. The insulation film 15 is one of a silicon oxide film (SiO), a silicon nitride film (SiN), a silicon oxynitride film (SiON), and a silicon carbon nitride film (SiCN), or is a film formed by layering at least two of these films, for example.

As depicted in FIG. 3, the second substrate part 20 includes a lower substrate (middle substrate) 210 and an upper substrate (top substrate) 220. The lower substrate 210 includes a first semiconductor substrate 211. For example, the first semiconductor substrate 211 is a silicon substrate including single crystal silicon. The amplification transistor AMP and an element isolation layer 213 surrounding the amplification transistor AMP are disposed on one surface (e.g. front surface 211a) side of the first semiconductor substrate 211. The element isolation layer 213 electrically isolates the amplification transistor AMP of one of the adjacent pixel units PU from the amplification transistor AMP of the other pixel unit PU.

The lower substrate 210 includes an insulation film 215 coating the front surface 211a of the first semiconductor substrate 211. The amplification transistor AMP and the element isolation layer 213 are coated with the insulation film 215. In addition, the lower substrate 210 includes an insulation film 217 coating the other surface (e.g. rear surface 211b) of the first semiconductor substrate 211. The insulation films 215 and 217 are each a film including one of SiO, SiN, SiON, and SiCN, or are each a film formed by layering at least two of them. The insulation film 15 of the first substrate part 10 and the insulation film 217 of the lower substrate 210 are bonded together to form an interlayer insulation film 51.

The upper substrate 220 includes a second semiconductor substrate 221. For example, the second semiconductor substrate 221 is a silicon substrate including single crystal silicon. The reset transistor RST, the selection transistor SEL, and the element isolation layer 223 are disposed on one surface (e.g. front surface 221a) side of the second semiconductor substrate 221. For example, the element isolation layer 223 is disposed between the reset transistor RST and the selection transistor SEL, and between the selection transistor SEL and the well layer of the second semiconductor substrate 221.

The upper substrate 220 includes an insulation film 225 coating the front surface 221a, the rear surface 221b, and side surfaces of the second semiconductor substrate 221. The insulation film 225 is a film including one of SiO, SiN, SiON, and SiCN, or is a film formed by layering at least two of them, for example. The insulation film 215 of the lower substrate 210 and the insulation film 225 of the upper substrate 220 are bonded together to form an interlayer insulation film 53.

The imaging device 1 includes a plurality of lines L1 to L10 that is disposed in the interlayer insulation films 51 and 53 and is electrically connected to at least one of the first substrate part 10 or the second substrate part 20. As depicted in FIGS. 2 and 3, the drain of the amplification transistor AMP and the power supply line VDD are electrically connected via the line L1. Four floating diffusions FD included in one pixel unit PU and a gate electrode AG of the amplification transistor AMP are electrically connected via the line L2. The source of the amplification transistor AMP and the drain of the selection transistor SEL are electrically connected via the line L3. A gate electrode SG of the selection transistor SEL and the pixel drive line 23 (see FIG. 1) are electrically connected via the line L4.

The source of the selection transistor SEL and the vertical signal line 24 are electrically connected via the line L5. The drain of the reset transistor RST and the power supply line VDD are electrically connected via the line L6. A gate electrode RG (see FIG. 4A which will be described later) of the reset transistor RST and the pixel drive line 23 are electrically connected via the line L7. The source of the reset transistor RST and the line L2 are electrically connected via the line L8. A gate electrode TG of the transfer transistor TR and the pixel drive line 23 (see FIG. 1) are electrically connected via the line L9 (which is one example of a first line). The well contact layer and a reference potential line that supplies a reference potential (e.g. ground potential: 0 V) are electrically connected via the line L10.

In the lines L1 to L10, portions that are extended in the thickness direction of the layered body include tungsten (W), and portions that are extended in a direction (e.g. the horizontal direction) orthogonal to the thickness direction of the layered body include copper (Cu) or a Cu alloy that mainly contains Cu. However, in the embodiments of the present disclosure, the materials of the lines L1 to L10 are not limited to these materials, and any other material may be used.

The second substrate part 20 includes a plurality of pad electrodes 227 that is connected to any lines (e.g. lines L1, L4 to L7, L9, and L10) of the above-described lines L1 to L10. The plurality of pad electrodes 227 includes Cu or a Cu alloy, for example.

The third substrate part 30 is disposed on a side (e.g. front surface side), of the second substrate part 20, opposite to a surface facing the first substrate part 10. The third substrate part 30 includes a semiconductor substrate 301, an insulation film 304 coating a front surface 301a side of the semiconductor substrate 301, a plurality of lines L30 disposed on the front surface 301a side of the semiconductor substrate 301, and a plurality of pad electrodes 305 that is connected to the plurality of lines L30. It is to be noted that the front surface of the third substrate part 30 and the front surface of the second substrate part 20 are bonded together, as explained later. Therefore, in FIG. 3, the front surface 301a of the semiconductor substrate 301 is directed downward.

The semiconductor substrate 301 is a silicon substrate including single crystal silicon, for example. A plurality of transistors constituting the logic circuit 32 (see FIG. 1) and an impurity diffusion layer are disposed on the front surface 301a side of the semiconductor substrate 301. The plurality of transistors constituting the logic circuit 32 and the impurity diffusion layer are coated with the insulation film 304. Contact holes connected to the transistors and the impurity diffusion layer are provided in the insulation film 304.

The lines L30 are disposed in the contact holes. Portions, of the lines L30, that are extended in the thickness direction of the third substrate part 30 include titanium (Ti) or cobalt (Co), and portions, of the lines L30, that are extended in a direction (e.g. the horizontal direction) orthogonal to the thickness direction of the third substrate part 30 includes Cu or a Cu alloy that mainly contains Cu. However, in the embodiments of the present disclosure, the materials of the lines L30 are not limited to these materials, and any other material may be used.

A silicide 39 (e.g. titanium silicide (TiSi) or cobalt silicide (CoSi$_2$)) is formed in a connection portion between each line L30 and the semiconductor substrate 301. Due to the silicide 39, the connection between the line L30 and the semiconductor substrate 301 becomes closer to an ohmic contact, so that the contact resistance is reduced. As a result, the computation speed of the logic circuit 32 is increased.

It is to be noted that no silicides are formed in the first substrate part 10 and the second substrate part 20. Accordingly, when the first substrate part 10 and the second substrate part 20 are formed, heat treatment or the like can be performed at a temperature higher than the heat-resistant temperature of the silicide. However, the embodiments of the present disclosure are not limited to this, and a silicide may be formed in at least one of the first substrate part 10 and the second substrate part 20.

The plurality of pad electrodes 305 includes Cu or a Cu alloy, for example. In the thickness direction of the imaging device 1, the pad electrodes 305 of the third substrate part 30 are opposed to the pad electrodes 227 of the second substrate part 20, and electrical connection is formed therebetween. For example, the pad electrodes 305 and 227 are integrated by Cu—Cu bonding while being opposed to each other. Accordingly, the second substrate part 20 and the third substrate part 30 are electrically connected to each other, and the bonding strength between the second substrate part 20 and the third substrate part 30 is increased.

FIGS. 4A to 4C are cross sectional views in the horizontal direction each depicting a configuration example of the pixel unit PU according to the first embodiment of the present disclosure. More specifically, FIG. 4A is a cross sectional view of the pixel unit PU taken along the horizontal direction at the position sec1 in FIG. 3. The position sec1 is at the same height of an upper surface of the gate electrode SG of the selection transistor SEL and an upper surface of the gate electrode RG of the reset transistor RST. FIG. 4B is a cross sectional view of the pixel unit PU taken along the horizontal direction at the position sec2 in FIG. 3. The position sec2 is at the same height of an upper surface of the gate electrode AG of the amplification transistor AMP. FIG. 4C is a cross sectional view of the pixel unit PU taken along the horizontal direction at the position sec3 in FIG. 3. The position sec1 is positioned at the same height of an upper surface of the gate electrode TG of the transfer transistor TR.

FIGS. 4A to 4C each depict one pixel unit PU and have the positional relation to overlap with one another in the thickness direction (e.g. Z-axis direction) of the layered body. The selection transistor SEL and the reset transistor RST depicted in FIG. 4A, the amplification transistor AMP depicted in FIG. 4B, and the four sensor pixels 12 depicted in FIG. 4C overlap with one another in the Z-axis direction. As depicted in FIG. 4A, a transistor group including the selection transistor SEL and the reset transistor RST is located in the center portion of the pixel unit PU in a plan view. A line group including the lines L2, L9, and L10 is located outside the transistor group. This line group is disposed to have bilateral symmetry with the transistor group being interposed in a plan view, the transistor group including the selection transistor SEL and the reset transistor RST. In addition, a well layer that is electrically isolated from the sources and the drains of the transistor group by the element isolation layer 223 is disposed in the second semiconductor substrate 221. This well layer is connected to the reference potential (e.g. ground potential: 0 V) via the line L10.

As depicted in FIG. 4B, the amplification transistor AMP is located in the center portion of the pixel unit PU in a plan view. The amplification transistor AMP, the selection transistor SEL, and the reset transistor RST are positioned so as to overlap one another in the thickness direction of the layered body. In addition, the line group including the lines L2, L9, and L10 is located outside the amplification transistor AMP in a plan view. This line group is disposed to have bilateral symmetry with the amplification transistor AMP being interposed in a plan view.

As depicted in FIG. 4C, the four sensor pixels 12 included in one pixel unit PU are disposed close to one another via the element isolation layer 16. In addition, in each of the four sensor pixels 12, the gate electrode TG of the transfer transistor TR is interposed between the floating diffusion FD and the well layer WE in a plan view. The gate electrode TG is a partition between the floating diffusion FD and the well layer WE. As depicted in FIG. 3, the photodiode PD is located below the floating diffusion FD, the well layer WE, and the gate electrode TG.

Figure 5:
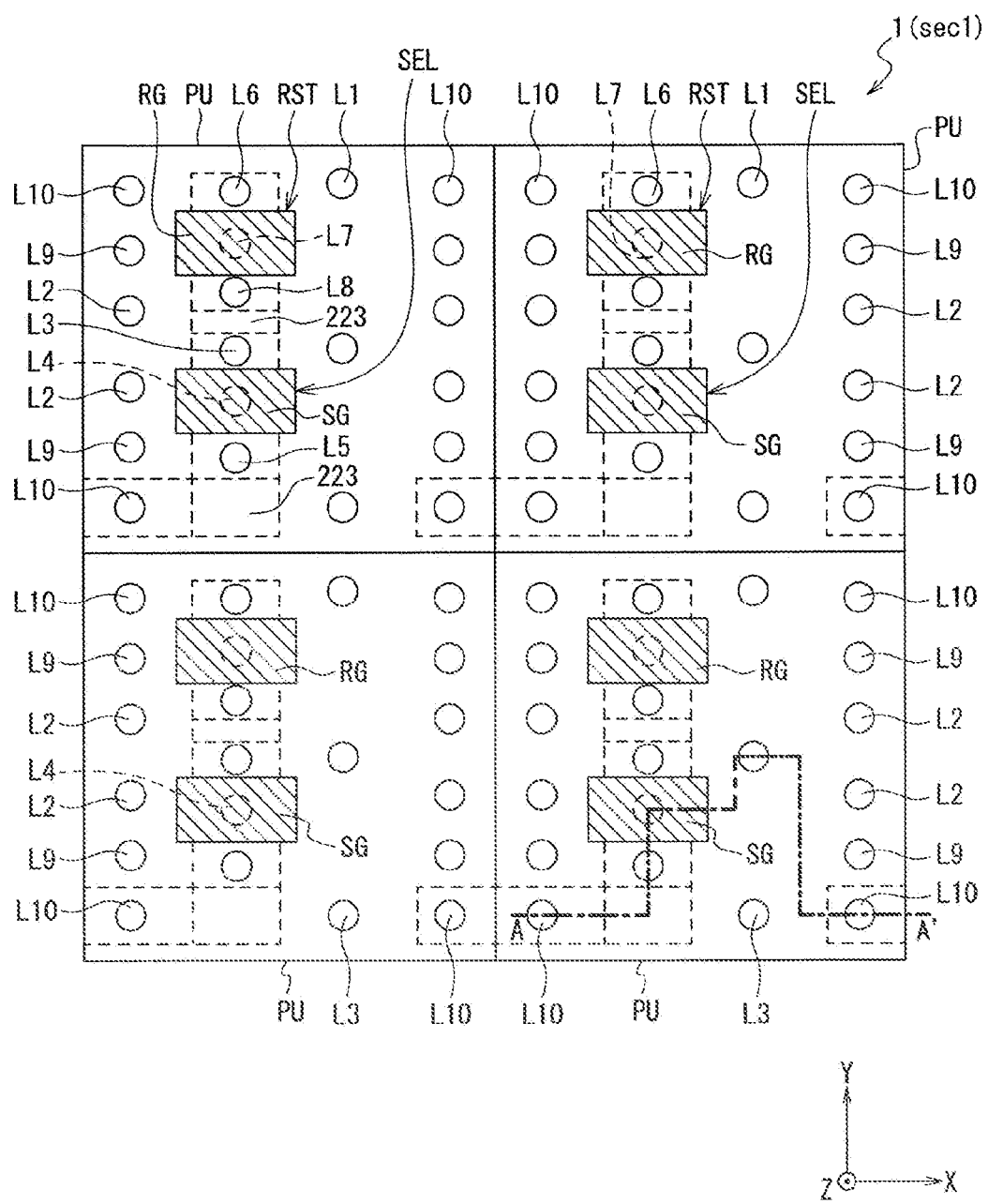
FIG. 5 is a cross sectional view in the horizontal direction of a layout example of a plurality of pixel units according to the first embodiment of the present disclosure.
Figure 6:
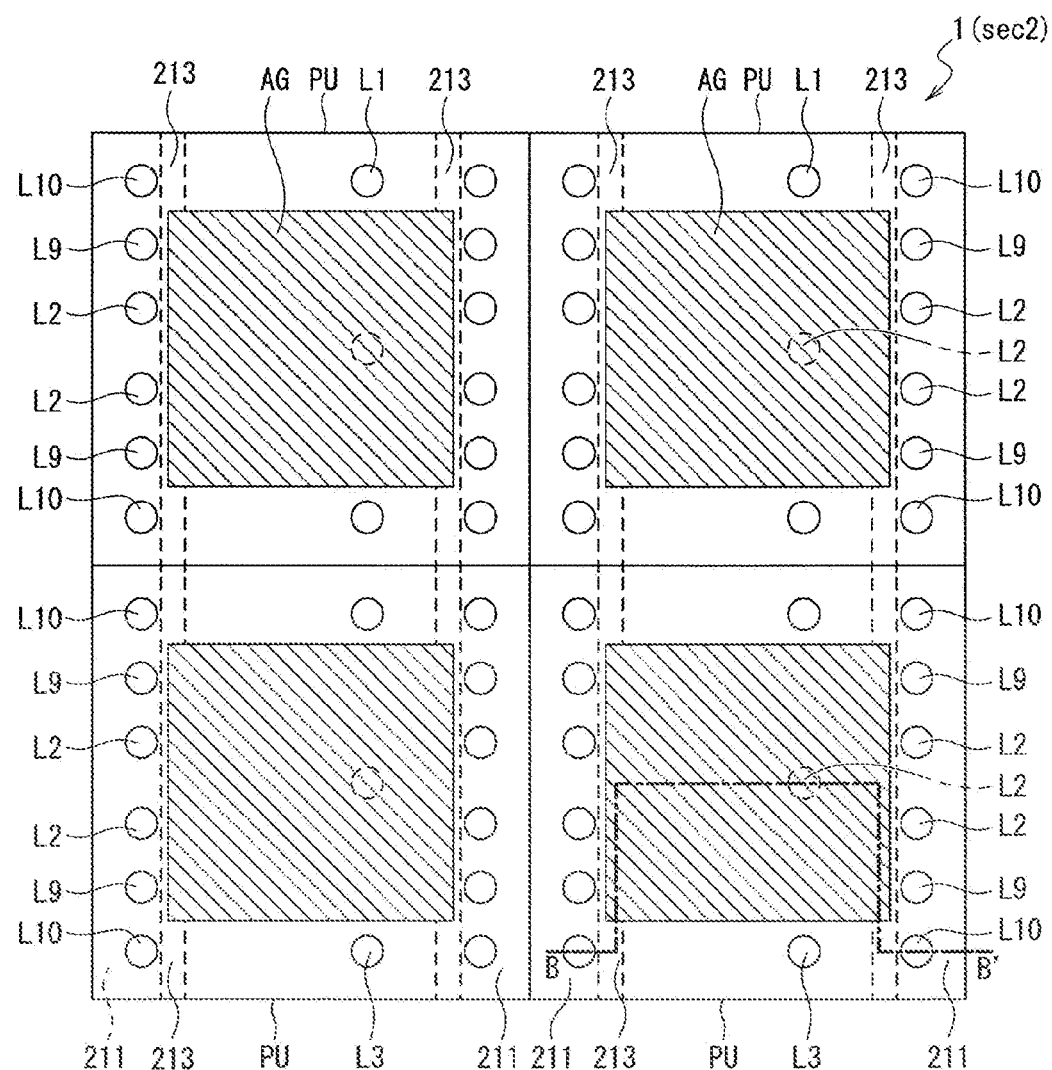
FIG. 6 is a cross sectional view in the horizontal direction of the layout example of the plurality of pixel units according to the first embodiment of the present disclosure.
Figure 7:
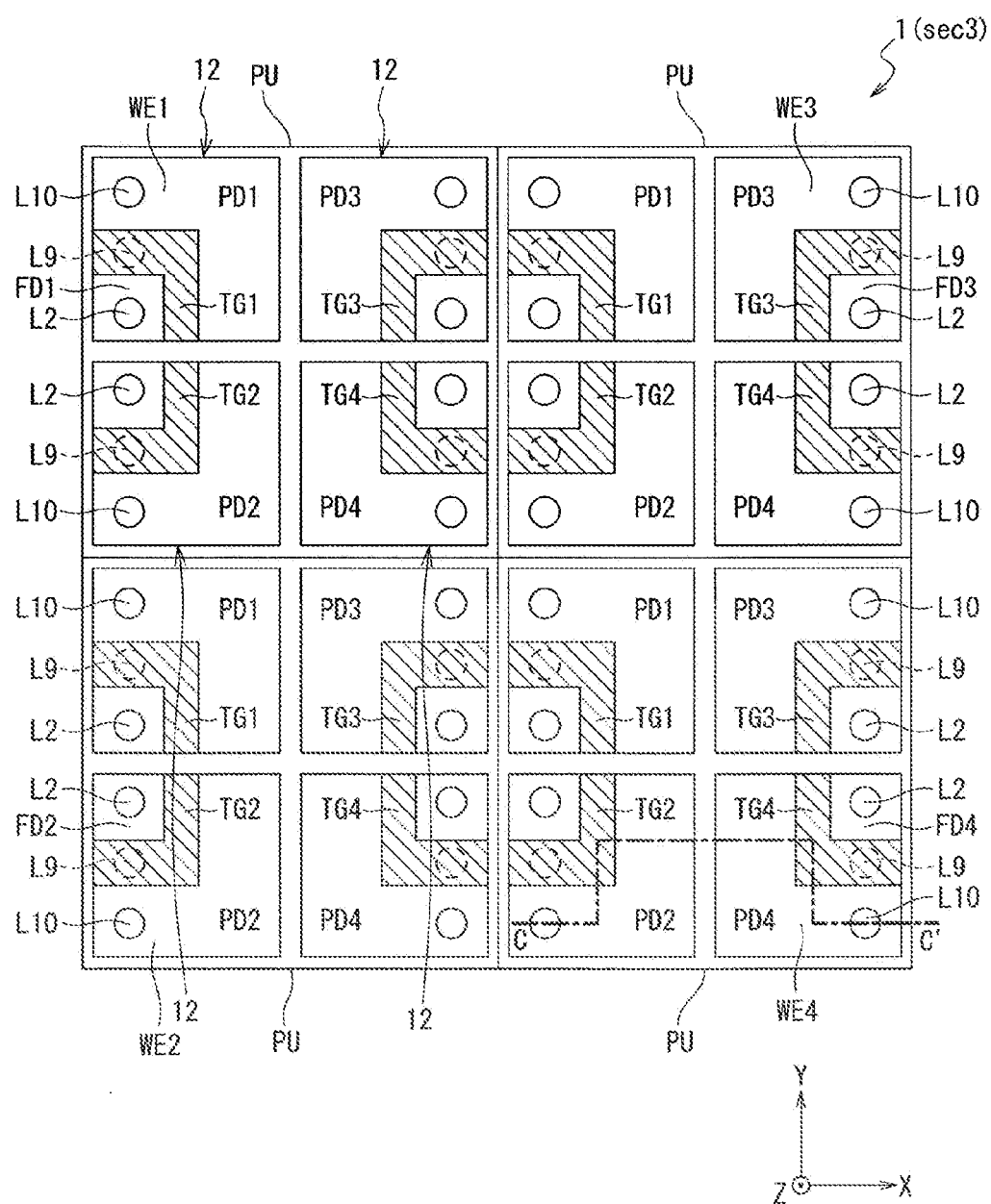
FIG. 7 is a cross sectional view in the horizontal direction of the layout example of the plurality of pixel units according to the first embodiment of the present disclosure.

FIGS. 5 to 7 are cross sectional views in the horizontal direction each depicting a layout example of a plurality of the pixel units PU according to the first embodiment of the present disclosure. More specifically, FIG. 5 is a cross sectional view of the imaging device 1 taken at the position sec3 in FIG. 3. FIG. 6 is a cross sectional view of the imaging device 1 taken at the position sec2 in FIG. 3. FIG. 7 is a cross sectional view of the first substrate part 10 taken at the position sec1 in FIG. 3. As depicted in FIGS. 5 to 7, the plurality of pixel units PU of the imaging device 1 is arranged at a fixed interval in the X-axis direction and at a fixed interval in the Y-axis direction. The pixel units PU are repeatedly arranged in the X-axis direction and the Y-axis direction.

Next, a manufacturing method of the imaging device 1 will be explained. It is to be noted that the imaging device 1 is manufactured with various devices such as a film formation device (including a CVD (Chemical Vapor Deposition) device and a sputtering device), an ion injection device, a heat treatment device, an etching device, a CMP (Chemical Mechanical Polishing) device, and a laminating device. Hereinafter, these devices are collectively referred to as a manufacturing device.

Figure 8:
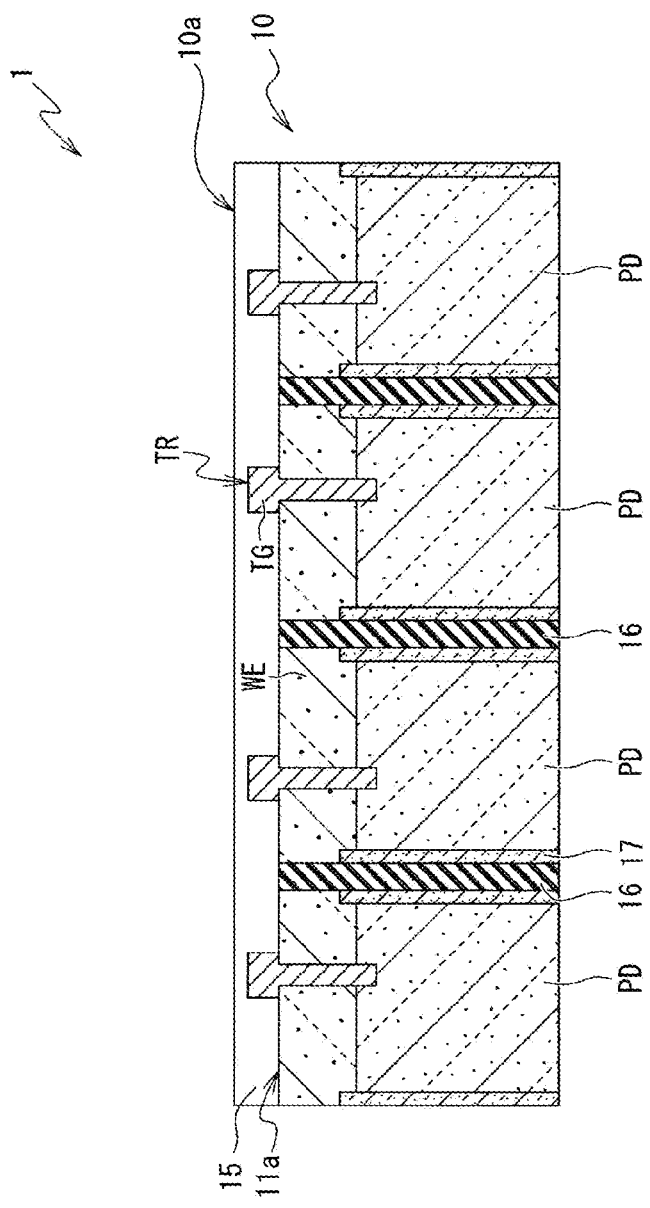
FIG. 8 is a cross sectional view of a manufacturing method of the imaging device according to the first embodiment of the present disclosure.

FIGS. 8 to 14 are cross sectional views of the manufacturing method of the imaging device 1 according to the first embodiment of the present disclosure. By using a CMOS process, the manufacturing device forms the well layer WE, the element isolation layer 16, the impurity diffusion layer 17, the photodiode PD, the gate electrode TG of the transfer transistor TR, the floating diffusion FD (see FIG. 4C), and the well contact layer on the front surface 11a side of the semiconductor substrate 11, as depicted in FIG. 8. Next, the manufacturing device forms the insulation film 15 on the front surface 11a side of the semiconductor substrate 11 and flattens a surface of the insulation film 15. For example, the insulation film 15 is formed by a CVD method. The insulation film 15 is flattened by CMP. As a result, the first substrate part 10 is completed.

Figure 9:
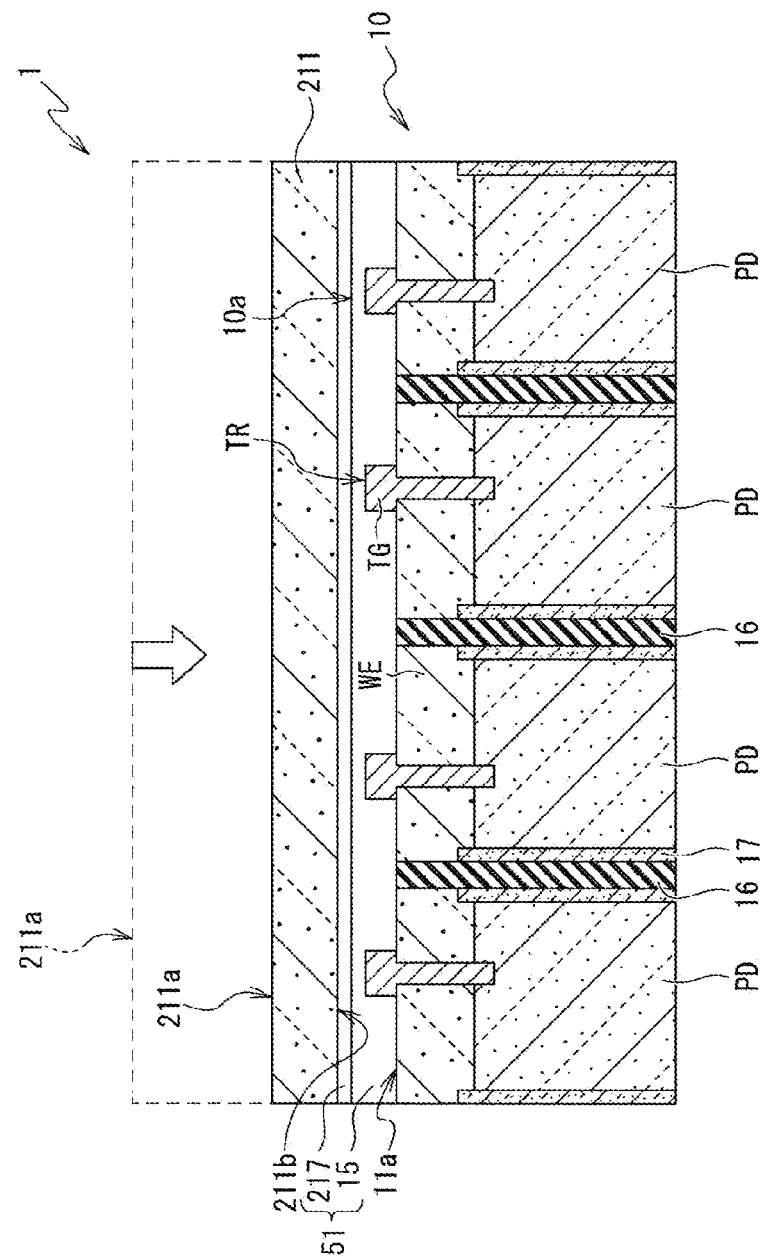
FIG. 9 is a cross sectional view of the manufacturing method of the imaging device according to the first embodiment of the present disclosure.

Next, as depicted in FIG. 9, the manufacturing device bonds the first semiconductor substrate 211 to the front surface 10a side of the first substrate part 10. For example, the rear surface 211b of the first semiconductor substrate 211 is coated with the insulation film 217 which is a silicon oxide film (SiO) or the like. The manufacturing device puts the front surface 11a of the semiconductor substrate 11 constituting the first substrate part 10 to be opposed to the rear surface 211b of the first semiconductor substrate 211. Subsequently, the manufacturing device applies heat treatment thereto while keeping close contact between the insulation film 15 coating the front surface 11a of the semiconductor substrate 11 and the insulation film 217 coating the rear surface 211b of the first semiconductor substrate 211. As a result, the insulation films 15 and 217 are integrated to form the interlayer insulation film 51, and the semiconductor substrate 11 and the first semiconductor substrate 211 are bonded together with the interlayer insulation film 51 interposed therebetween, as depicted in FIG. 9. Thereafter, the manufacturing device thins the first semiconductor substrate 211 (that is, reduces the thickness) by grinding the front surface 211a side of the first semiconductor substrate 211. The first semiconductor substrate 211 is thinned by CMP.

Figure 10:
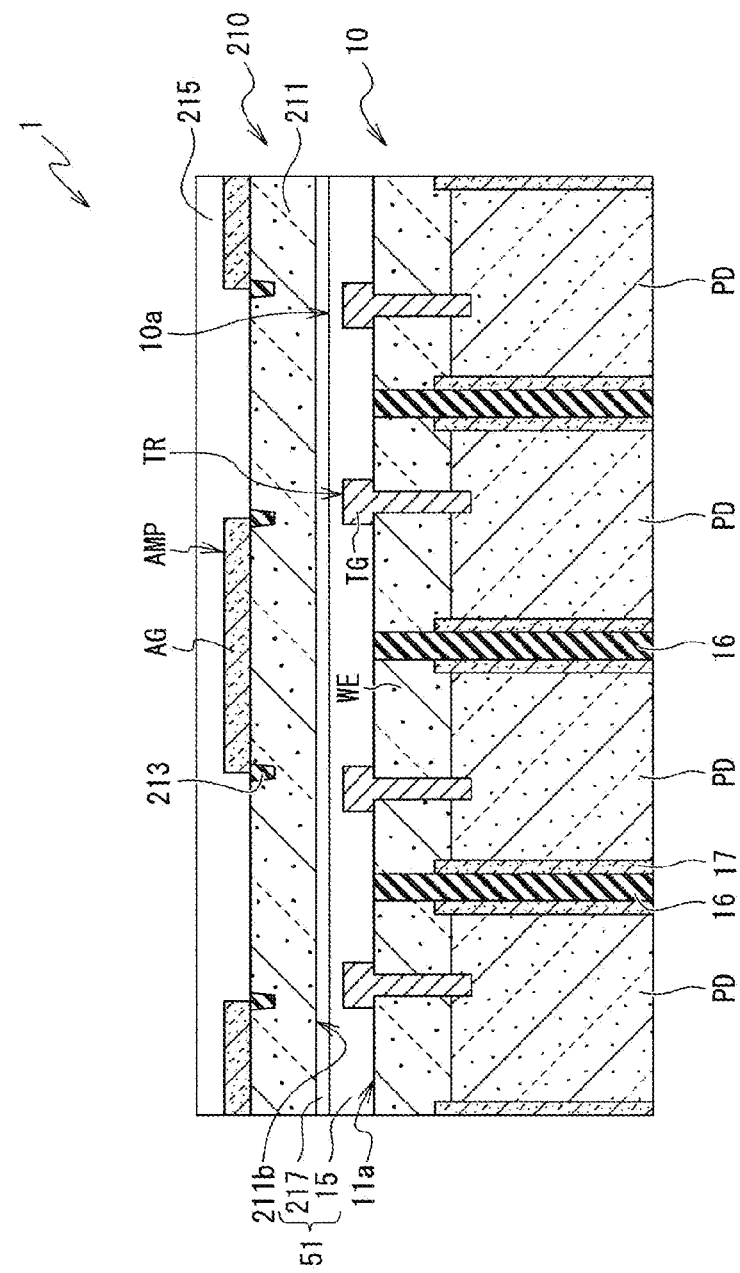
FIG. 10 is a cross sectional view of the manufacturing method of the imaging device according to the first embodiment of the present disclosure.

Next, by using a CMOS process, the manufacturing device forms the element isolation layer 213 and the amplification transistor AMP on the front surface 211a side of the thinned first semiconductor substrate 211, as depicted in FIG. 10. For example, after forming the element isolation layer 213, the manufacturing device forms the gate electrode AG of the amplification transistor AMP on the front surface 221a of the second semiconductor substrate 221. Next, the manufacturing device forms the source and the drain of the amplification transistor AMP on both sides of the gate electrode AG. Thereafter, the manufacturing device forms the insulation film 215 on the front surface 221a side of the second semiconductor substrate 221 by a CVD method and flattens a surface of the insulation film 215 by a CMP method.

Figure 11:
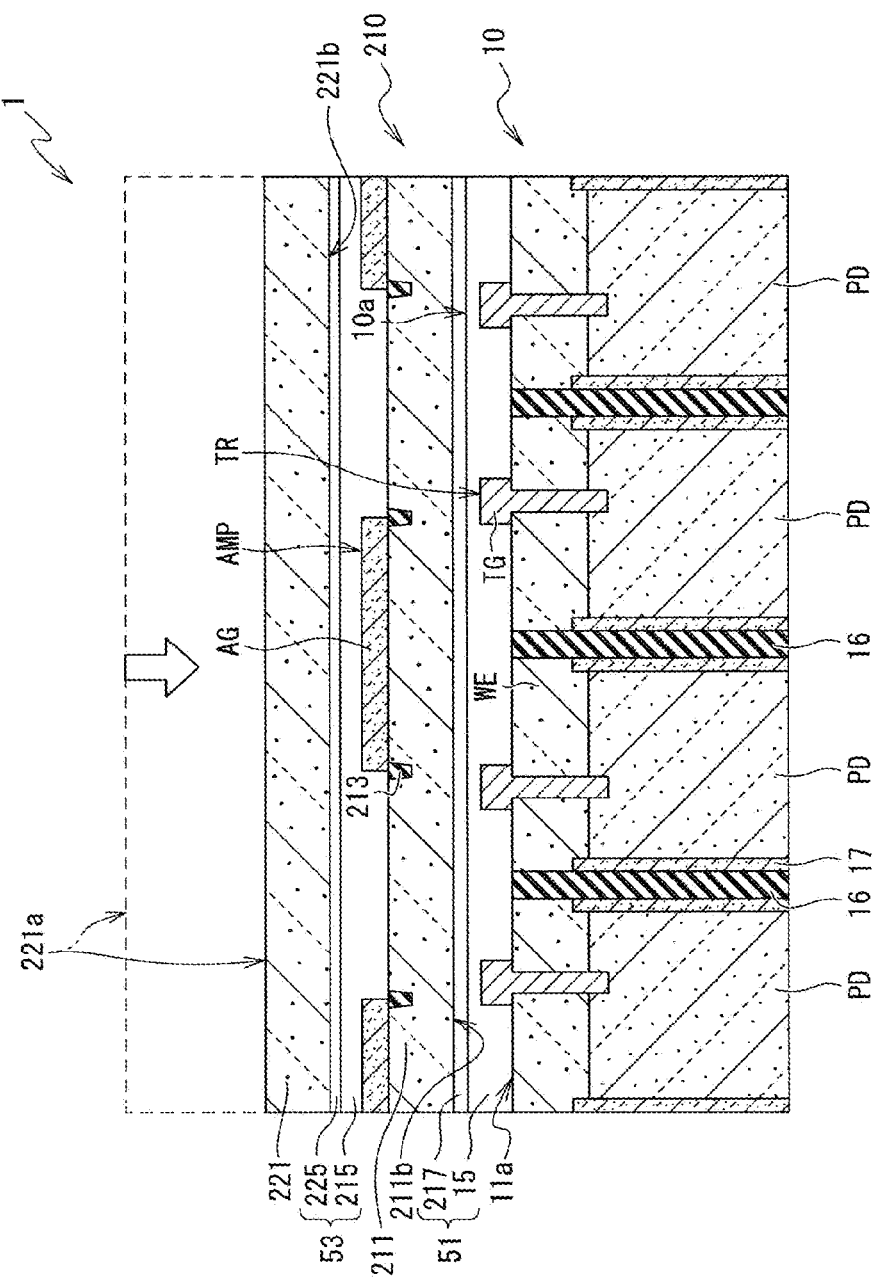
FIG. 11 is a cross sectional view of the manufacturing method of the imaging device according to the first embodiment of the present disclosure.

Next, the manufacturing device bonds the second semiconductor substrate 221 to the front surface 211a side of the first semiconductor substrate 211, as depicted in FIG. 11. For example, the rear surface 211b of the second semiconductor substrate 221 is coated with an insulation film 225A which is a silicon oxide film (SiO) or the like. The insulation film 225A is a portion of the insulation film 225 (see FIG. 3). The manufacturing device puts the front surface 211a of the first semiconductor substrate 211 so as to be opposed to the rear surface 221b of the second semiconductor substrate 221. Subsequently, the manufacturing device applies heat treatment thereto while keeping close contact between the insulation film 215 coating the front surface 211a of the first semiconductor substrate 211 and the insulation film 225A coating the rear surface 221b of the second semiconductor substrate 221. As a result, the insulation films 215 and 225A are integrated to form the interlayer insulation film 53, and the first semiconductor substrate 211 and the second semiconductor substrate 221 are bonded together with the interlayer insulation film 53 interposed therebetween, as depicted in FIG. 11. Thereafter, the manufacturing device thins the second semiconductor substrate 221 by grinding the front surface 221a side of the second semiconductor substrate 221. The second semiconductor substrate 221 is thinned by CMP.

Figure 12:
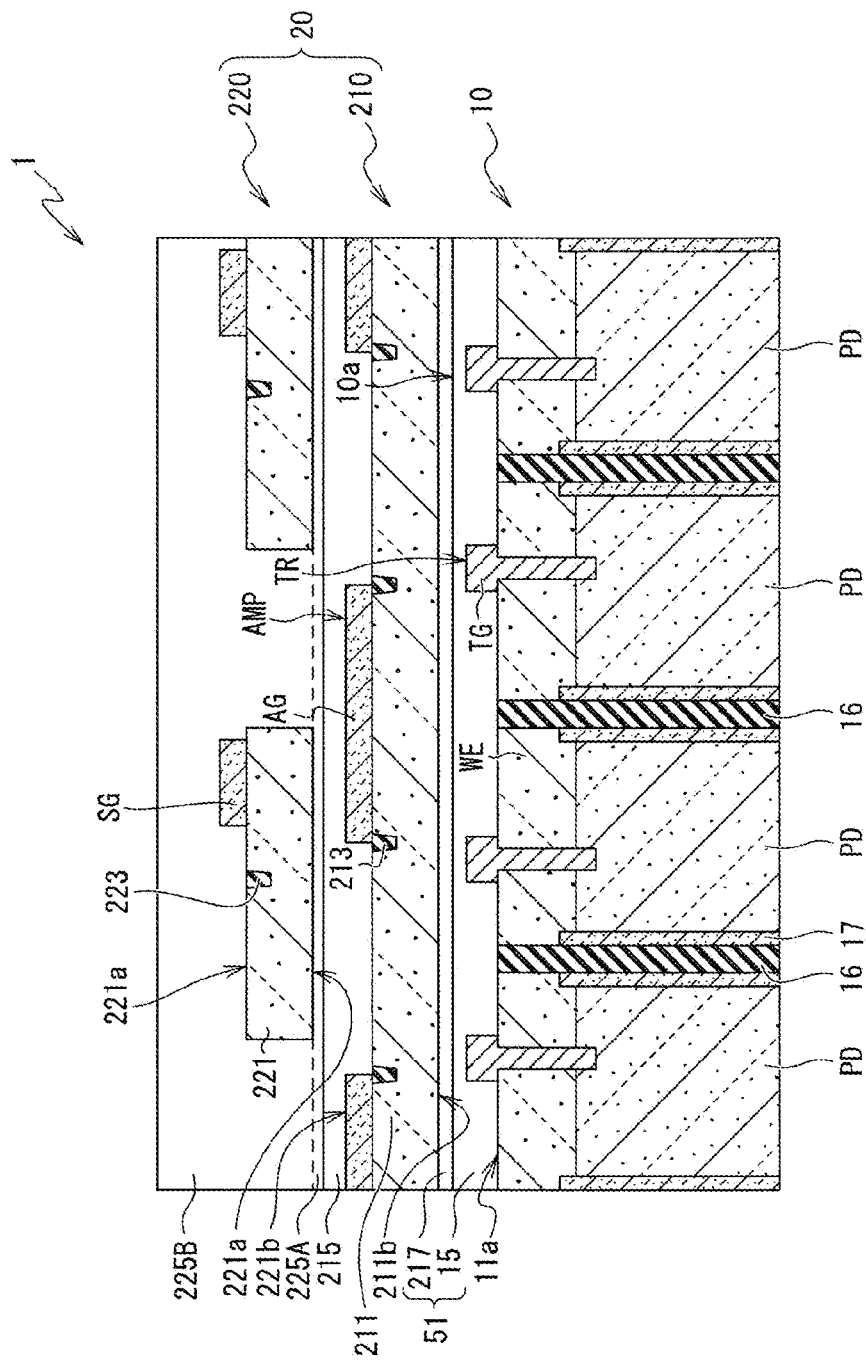
FIG. 12 is a cross sectional view of the manufacturing method of the imaging device according to the first embodiment of the present disclosure.

Next, the manufacturing device forms the second semiconductor substrate 221 into an island-like shape in a plan view by removing portions of the second semiconductor substrate 221, as depicted in FIG. 12. The portions of the second semiconductor substrate 221 are removed by, for example, forming a resist pattern through a photolithography technology, and dry-etching the second semiconductor substrate 221 with the resist pattern serving as a mask. In this dry-etching, the insulation film 225A disposed under the second semiconductor substrate 221 is used as an etching stopper.

In addition, before or after the step of forming the second semiconductor substrate 221 into an island-like shape or in parallel with the step, the manufacturing device forms the element isolation layer 223, the selection transistor SEL, and the reset transistor RST on the front surface 221a side of the second semiconductor substrate 221, by using a CMOS process. For example, after forming the element isolation layer 213, the manufacturing device forms the gate electrode SG of the selection transistor SEL and the gate electrode RG of the reset transistor RST on the front surface 221a of the second semiconductor substrate 221. The gate electrodes SG and RG may be formed simultaneously in the same step. Next, the manufacturing device forms the source and the drain of the selection transistor SEL on both sides of the gate electrode SG. In addition, the manufacturing device forms the source and the drain of the reset transistor RST on both sides of the gate electrode RG. The source and the drain of the selection transistor SEL and the source and the drain of the reset transistor RST may be formed simultaneously in the same step.

It is to be noted that the step of forming the second semiconductor substrate 221 into an island-like shape may be performed before a step, which will be explained later, of forming the element isolation layer 223, the selection transistor SEL, and the reset transistor RST, or may be performed after the step, or may be performed in parallel with the step.

After the step of forming the element isolation layer 223, the selection transistor SEL, and the reset transistor RST and the step of forming the second semiconductor substrate 221 into an island-like shape are performed, the manufacturing device forms an insulation film 225B on the front surface 221a side of the second semiconductor substrate 221 by a CVD method. The insulation film 225B is a portion of the insulation film 225. Next, the manufacturing device flattens a surface of the insulation film 225B by a CMP method.

Figure 13:
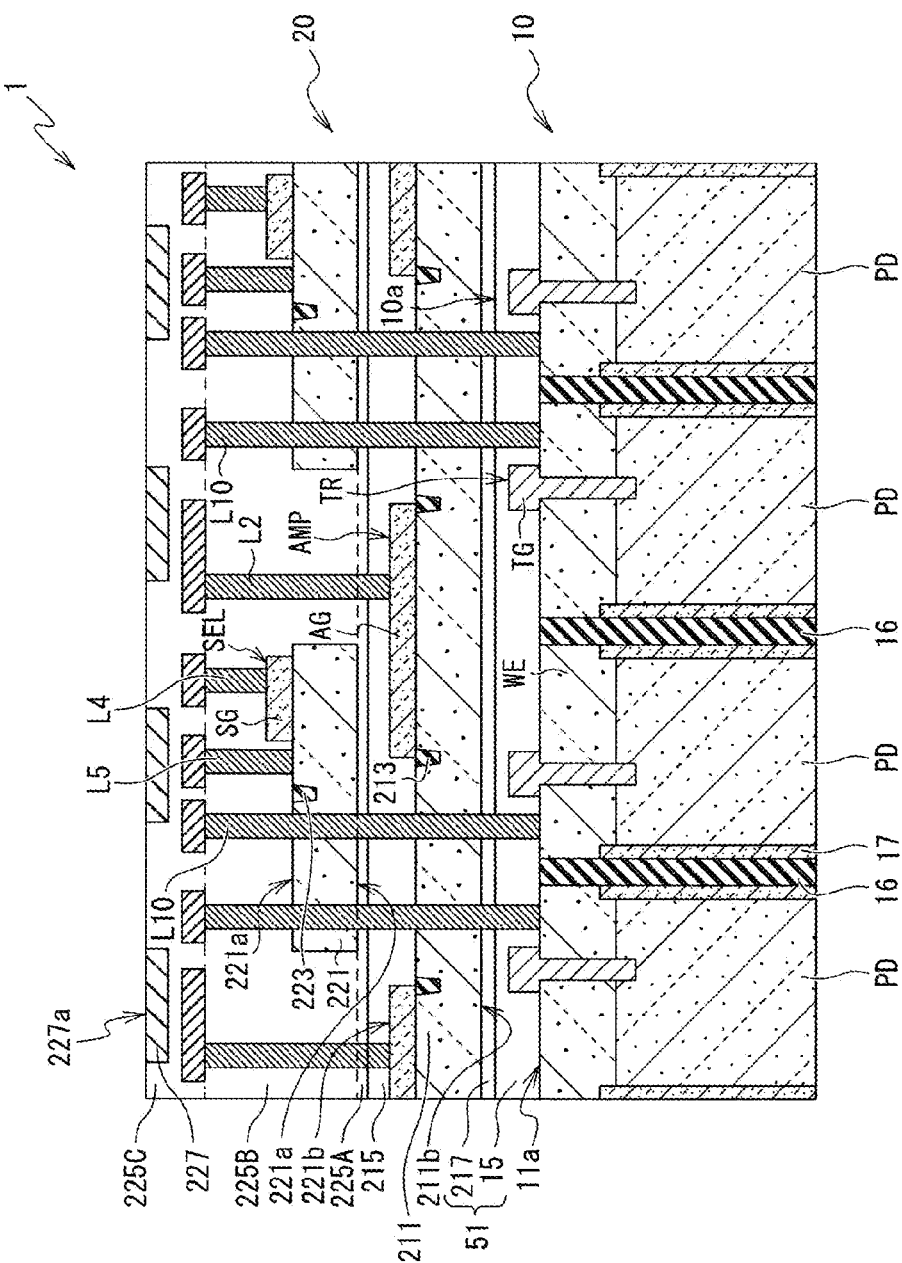
FIG. 13 is a cross sectional view of the manufacturing method of the imaging device according to the first embodiment of the present disclosure.

Next, as depicted in FIG. 13, the manufacturing device forms the lines L1 to L10 depicted in FIGS. 3 and 4A to 4C, the plurality of pad electrodes 227, and an insulation film 225C. The insulation film 225C is a portion of the insulation film 225. For example, a step of forming a contact hole in the insulation film or the semiconductor substrate, a step of forming a metal material on the insulation film and in the contact hole, a step of patterning the metal material, a step of forming an insulation film, and a step of flattening the insulation film, are repeated multiple times by the manufacturing device. As previously explained, the lines extending in a vertical direction include tungsten (W), and the lines extending in the horizontal direction and the pad electrodes include Cu or a Cu alloy. The manufacturing device forms the insulation film 225C so as to coat the pad electrodes 227, and then, flattens a surface of the insulation film 225C by a CMP method, so that front surfaces 227a of the pad electrodes 227 are exposed from the insulation film 225C. As a result, the second substrate part 20 is completed.

Figure 14:
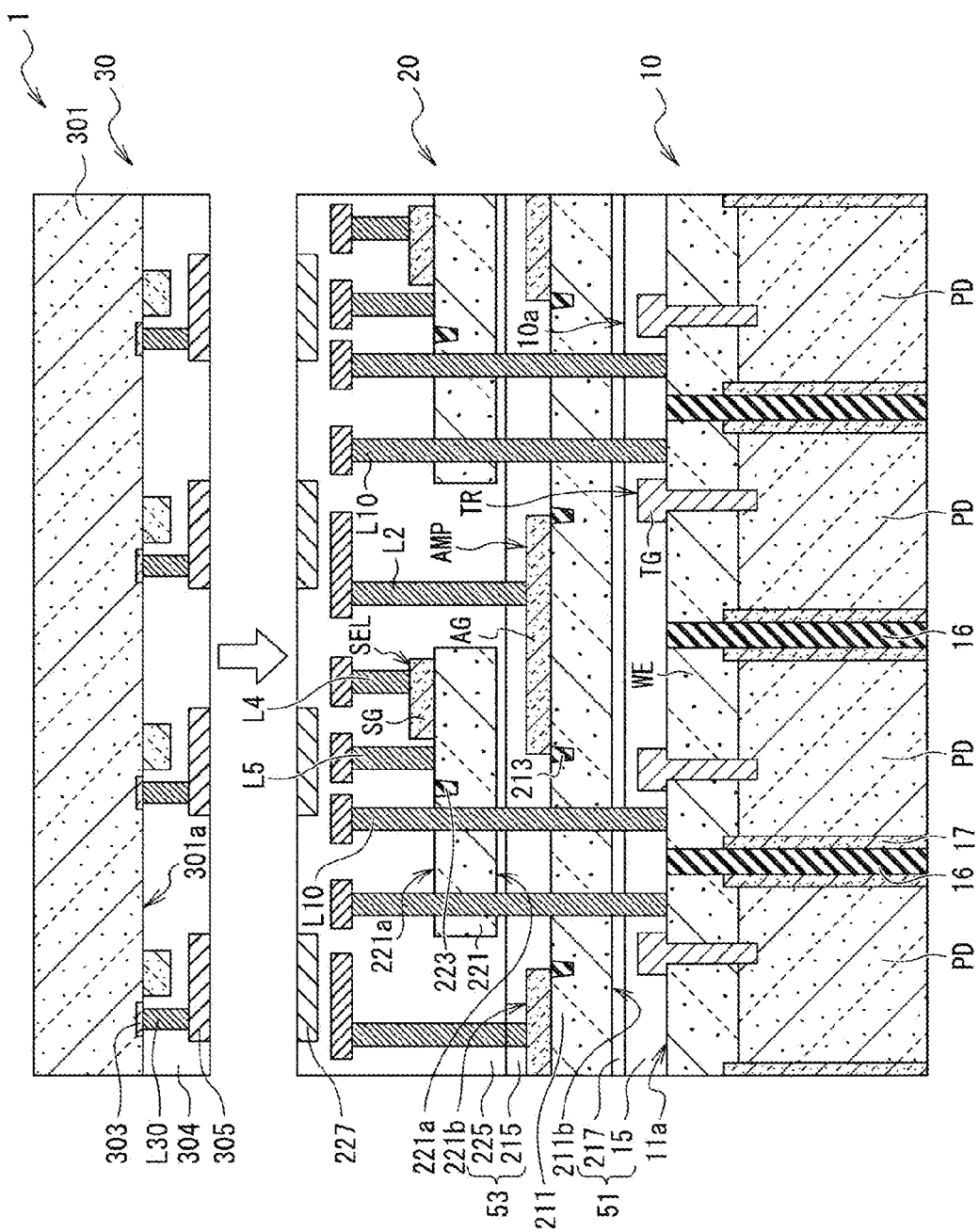
FIG. 14 is a cross sectional view of the manufacturing method of the imaging device according to the first embodiment of the present disclosure.

Before or after the step of forming the first substrate part 10 and the second substrate part 20 or in parallel with the step, the manufacturing device creates the third substrate part 30, as depicted in FIG. 14. For example, the manufacturing device forms the logic circuit 32 (see FIG. 1) on the front surface 301a of the semiconductor substrate 301 by using a CMOS process. In the step of forming the logic circuit 32, the silicide 39 is formed in a connection region between the semiconductor substrate 301 and the line L30. The silicide 39 includes a compound of the material of the semiconductor substrate 301 and the material of the line L30. For example, in the step of forming the logic circuit 32, a silicide, which is formed by a salicide (Self Aligned Silicide) process using $CoSi_2$, NiSi, or the like, is formed on a surface of an impurity diffusion region in the semiconductor substrate 301.

Here, the sensor pixels 12 are formed in the first substrate part 10, the reading circuit 22 is formed in the second substrate part 20, and the logic circuit 32 is formed in the third substrate part 30. No silicides are formed in the sensor pixels 12 of the first substrate part 10 and in the reading circuit 22 of the second substrate part 20. Accordingly, in the above-mentioned step of forming the sensor pixels 12 or in the above-mentioned step of forming the reading circuit 22, high-temperature processing such as thermal oxidation can be performed, irrespective of the heat resistant temperature of silicides.

After forming the third substrate part 30, the manufacturing device puts the front surface 301a of the semiconductor substrate 301 constituting the third substrate part 30 so as to be opposed to the front surface 221a of the second semiconductor substrate 221 constituting the second substrate part 20. Then, the manufacturing device applies heat treatment thereto while keeping close contact between the insulation film 304 located on the front surface 301a side of the semiconductor substrate 301 and the insulation film 225 located on the front surface 221a side of the second semiconductor substrate 221. As a result, the insulation films 304 and 225 are integrated to form an interlayer insulation film, and the second semiconductor substrate 221 and the semiconductor substrate 301 are bonded together with the interlayer insulation film interposed therebetween, as depicted in FIG. 3. The semiconductor substrate 11 of the first substrate part 10, the first semiconductor substrate 211 and the second semiconductor substrate 221 of the second substrate part 20, and the semiconductor substrate 301 of the third substrate part 30 are layered in a sequential manner with the insulation films interposed therebetween.

Also, in the step of applying the heat treatment, the pad electrodes 305 of the third substrate part 30 and the pad electrodes 227 of the second substrate part 20 are integrated by Cu—Cu bonding. This Cu—Cu bonding contributes greatly to improvement of the bonding strength between the second substrate part 20 and the third substrate part 30. Through the above-mentioned steps, the imaging device 1 is completed.

As explained so far, the imaging device 1 according to the first embodiment of the present disclosure includes the first substrate part 10 that includes the sensor pixels 12 to perform photoelectric conversion, and the second substrate part 20 that is disposed on the front surface 12a side of the first substrate part 10 and that includes the reading circuit 22 to output pixel signals based on electric charges outputted from the sensor pixels 12. The second substrate part 20 includes the first semiconductor substrate 211 on which the amplification transistor AMP included in the reading circuit 22 is disposed, and the second semiconductor substrate 221 which is disposed on the front surface 211a side of the first semiconductor substrate 211 and on which the selection transistor SEL and the reset transistor RST included in the reading circuit 22 are disposed.

According to the above configuration, the area of the arrangement region of the transistors can be increased, compared to a case where all the transistors included in the reading circuit 22 are disposed on a single semiconductor substrate. Therefore, the degree of freedom in the layout on the reading circuit 22 is improved. Accordingly, the gate area in the amplification transistor AMP can be maximized in each pixel unit PU, so that good noise characteristics can be achieved. Since the area of the amplification transistor AMP is maximized, random noise that is generated in the imaging device 1 can be reduced.

Second Embodiment

In the above first embodiment, the manufacturing method of the second substrate part 20, which involves layering the second semiconductor substrate 221 on the first semiconductor substrate 211, has been explained. However, the manufacturing method of the second substrate part 20 according to the embodiments of the present disclosure is not limited to the above-mentioned one.

Figure 15:
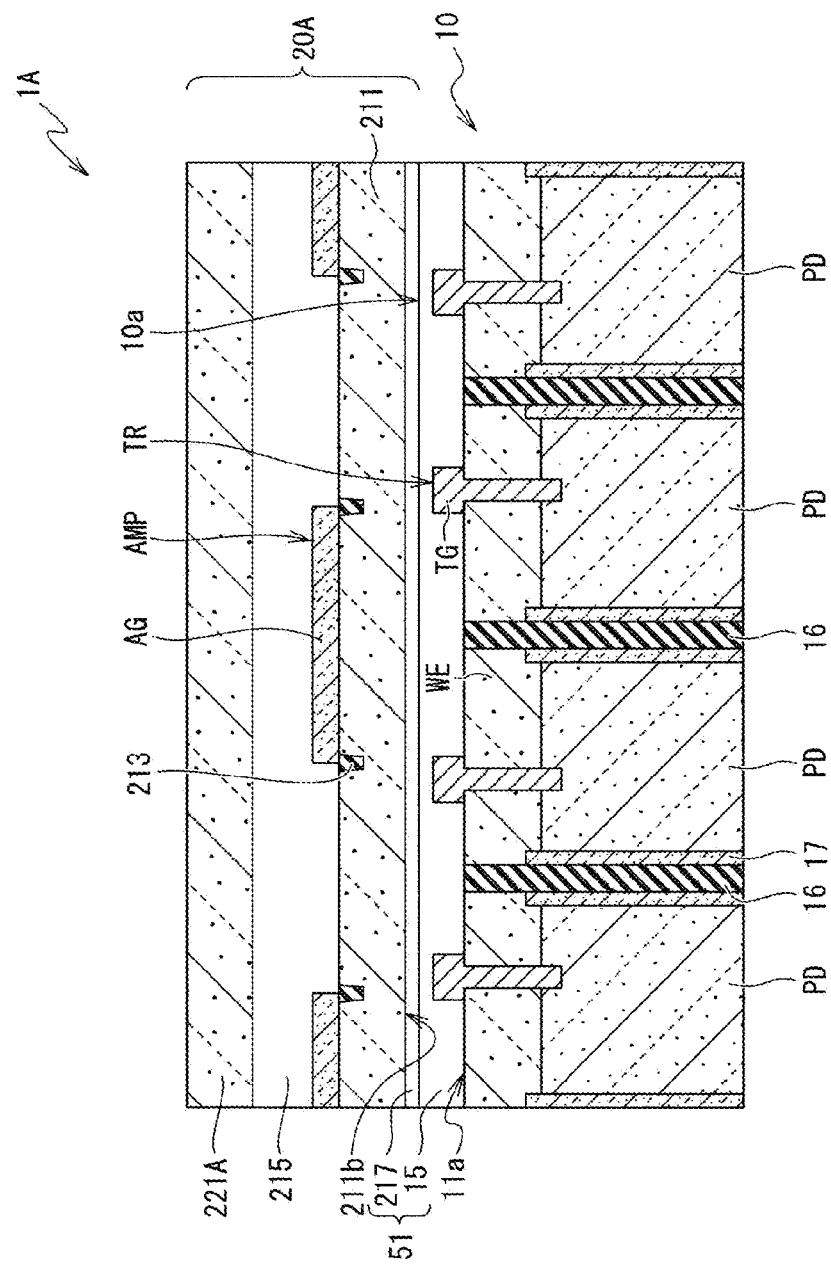
FIG. 15 is a cross sectional view of a manufacturing method of an imaging device according to a second embodiment of the present disclosure.
Figure 16:
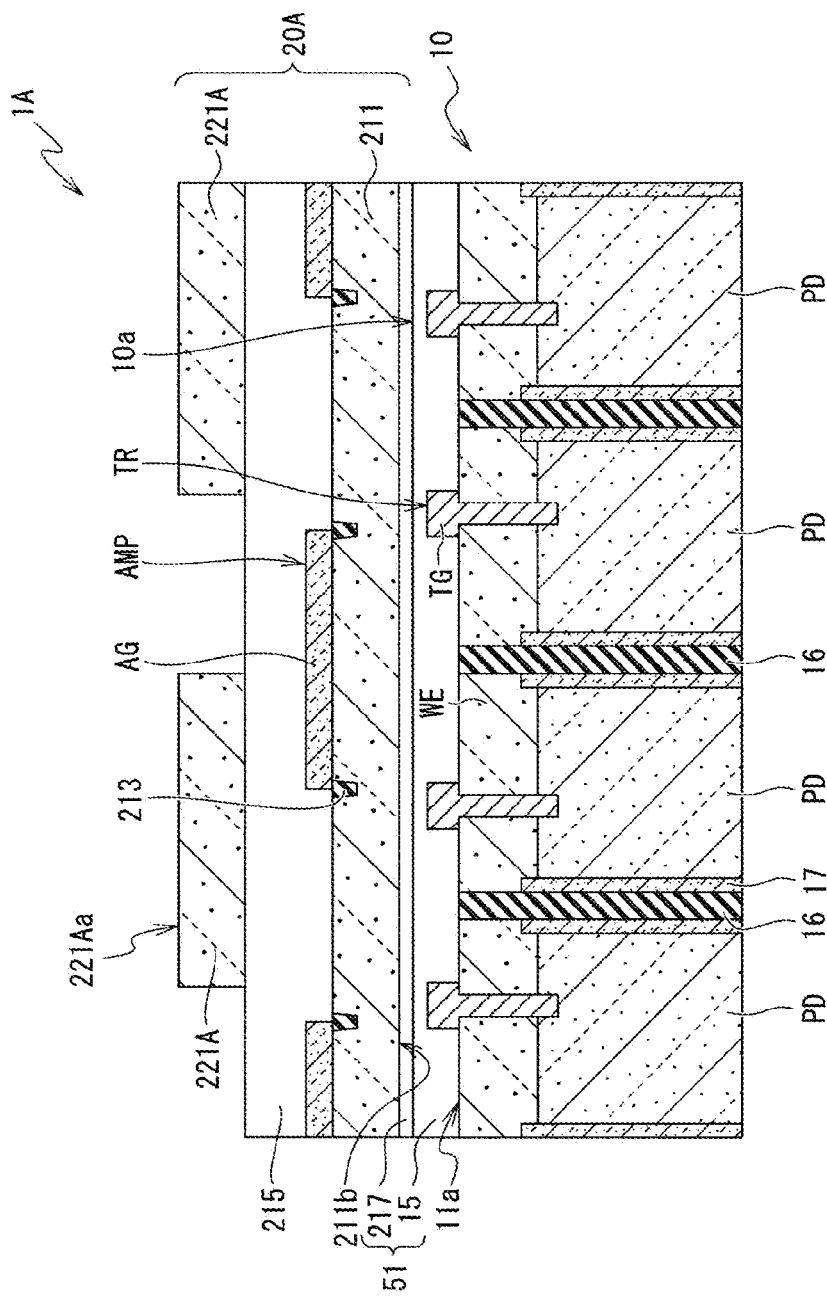
FIG. 16 is a cross sectional view of the manufacturing method of the imaging device according to the second embodiment of the present disclosure.

FIGS. 15 and 16 are cross sectional views of a manufacturing method of an imaging device 1A according to a second embodiment of the present disclosure. In FIG. 15, the steps up to forming the insulation film 215 on the front surface 221a side of the second semiconductor substrate 221 and flattening the surface thereof are identical to those in the first embodiment. After the insulation film 215 is flattened, the manufacturing device forms a semiconductor film 221A on the insulation film 215. Examples of the semiconductor film 221A include an oxide semiconductor such as poly-silicon (Poly-Si), poly-germanium (Poly-Ge), or IGZO (InGaZnO), a 2D material (substantially two-dimensional material having such a small thickness of one or few atoms), any one of III-V semiconductors, and a layered film containing at least any one of these semiconductors.

Next, the manufacturing device forms the semiconductor film 221A into an island-like shape in a plan view by removing portions of the semiconductor film 221A, as depicted in FIG. 16. The portions of the semiconductor film 221A are removed by, for example, forming a resist pattern through a photolithography technology and dry-etching the semiconductor film 221A with the resist pattern serving as a mask. In this dry-etching, the insulation film 215 is used as an etching stopper.

In addition, before or after the step of forming the semiconductor film 221A into an island-like shape or in parallel with the step, the manufacturing device forms the element isolation layer 223, the selection transistor SEL, and the reset transistor RST (see FIG. 4A) on a front surface 221Aa side of the semiconductor film 221A, by using a CMOS process. For example, after forming the element isolation layer 213, the manufacturing device forms the gate electrode SG of the selection transistor SEL and the gate electrode RG of the reset transistor RST on the front surface 221Aa of the semiconductor film 221A. The gate electrodes SG and RG may be formed simultaneously in the same step. Next, the manufacturing device forms the source and the drain of the selection transistor SEL on both sides of the gate electrode SG. In addition, the manufacturing device forms the source and the drain of the reset transistor RST on both sides of the gate electrode RG. The source and the drain of the selection transistor SEL and the source and the drain of the reset transistor RST may be formed simultaneously in the same step.

It is to be noted that the step of forming the semiconductor film 221A into an island-like shape may be performed before a step, which will be explained later, of forming the element isolation layer 223, the selection transistor SEL, and the reset transistor RST, or may be performed after the step, or may be performed in parallel with the step.

The following steps are identical to those in the first embodiment. The manufacturing device forms the insulation film 225B (see FIG. 12) on the front surface 221Aa side of the semiconductor film 221A and flattens the surface of the insulation film 225B. Next, the manufacturing device forms the lines L1 to L10 depicted in FIGS. 3 and 4A to 4C, the plurality of pad electrodes 227 (see FIG. 13), and the insulation film 225C (see FIG. 13). Then, the manufacturing device exposes the front surfaces 227a (see FIG. 13) of the pad electrodes 227 from the insulation film 225C. As a result, the second substrate part 20 is completed. After forming the second substrate part 20, the manufacturing device bonds the third substrate part 30 to the second substrate part 20. As a result, the imaging device 1A is completed.

The imaging device 1A according to the second embodiment of the present disclosure includes the first substrate part 10 that includes the sensor pixels to perform photoelectric conversion, and the second substrate part 20A that is disposed on the front surface 12a side of the first substrate part 10 and that includes the reading circuit 22 to output pixel signals based on electric charges outputted from the sensor pixels 12. The second substrate part 20A includes the first semiconductor substrate 211 on which the amplification transistor AMP included in the reading circuit 22 is disposed, and the semiconductor film 221A which is disposed on the front surface 211a side of the first semiconductor substrate 211 and on which the selection transistor SEL and the reset transistor RST included in the reading circuit 22 are disposed.

According to the above configuration, the area of the arrangement region of the transistors can be increased, compared to a case where all the transistors included in the reading circuit 22 are disposed only on a surface of a substrate. Therefore, the degree of freedom in the layout on the reading circuit 22 is improved. Accordingly, the gate area in the amplification transistor AMP can be maximized in each pixel unit PU, so that good noise characteristics can be achieved. Since the area of the amplification transistor AMP is maximized, random noise that is generated in the imaging device 1 can be reduced.

Noise characteristics required for the selection transistor and the reset transistor are less strict than those required for the amplification transistor. For this reason, even in a case where the selection transistor SEL and the reset transistor RST are formed on the semiconductor film 221A that is not a single crystal semiconductor substrate but includes poly silicon or the like, as in the second embodiment, the imaging device 1A can achieve good noise characteristics.

Third Embodiment

In the above-mentioned first embodiment, the structure in which the line L2 (i.e. floating diffusion contact) that is electrically connected to the floating diffusion FD and the line L10 (i.e. well contact) that is electrically connected to the well layer WE are provided for each of the plurality of sensor pixels 12 has been explained (see FIG. 4). However, the embodiments of the present disclosure are not limited to this structure. In an embodiment of the present disclosure, one floating diffusion contact may be disposed for every plurality of sensor pixels 12. For example, four adjacent sensor pixels 12 may share one floating diffusion contact. Similarly, one well contact may be disposed for every multiple sensor pixels 12. For example, four adjacent sensor pixels 12 may share one well contact.

Figure 17:
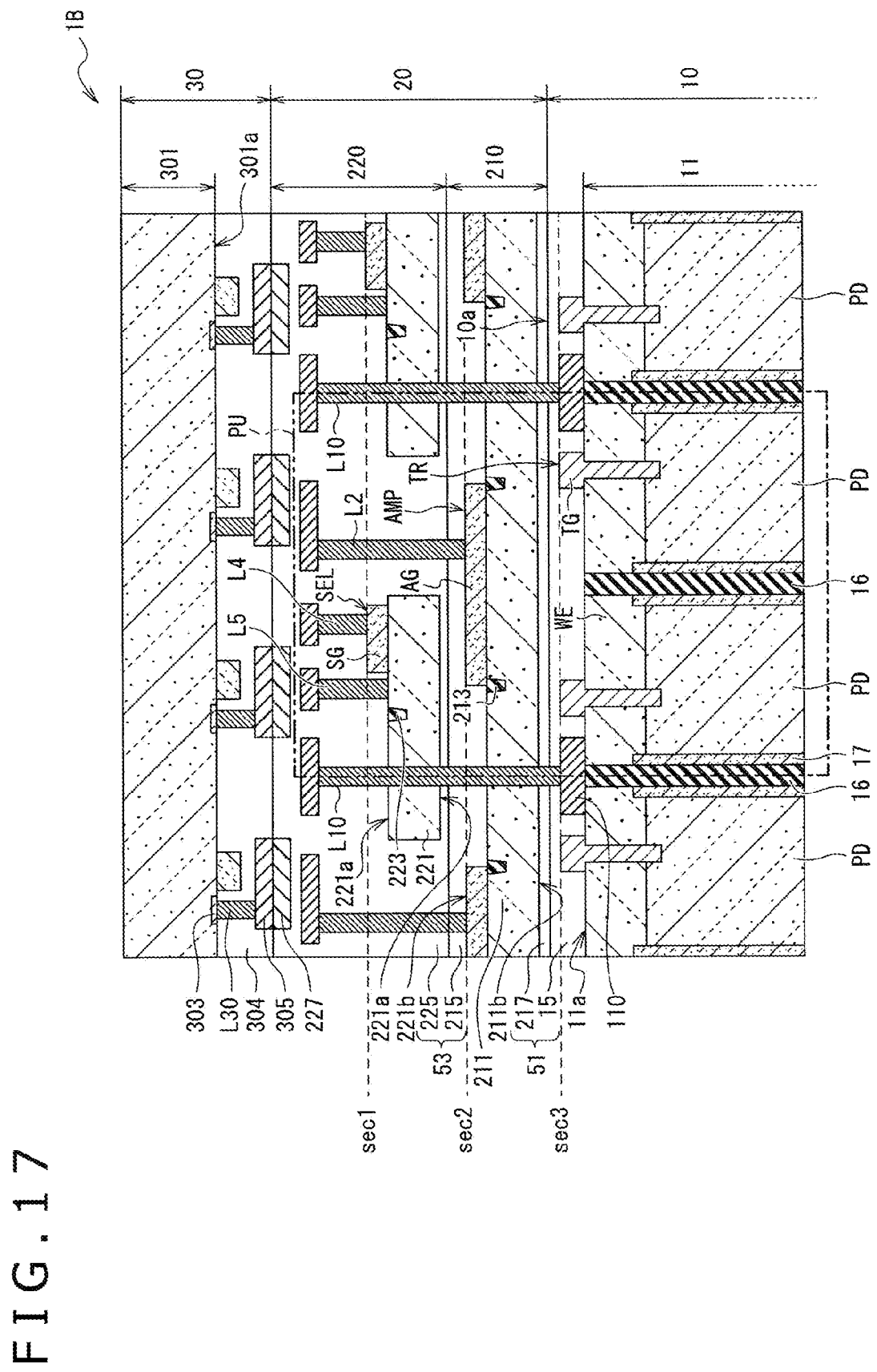
FIG. 17 is a cross sectional view in the thickness direction of a configuration example of an imaging device according to a third embodiment of the present disclosure.
Figure 18:
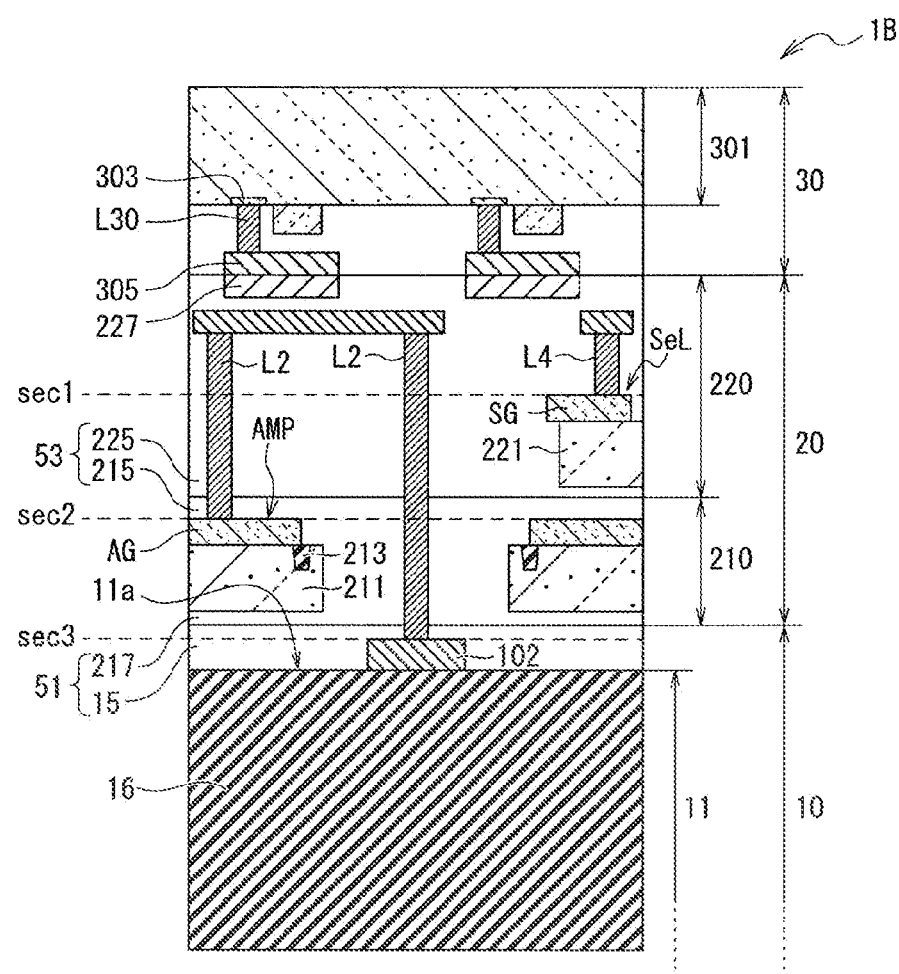
FIG. 18 is a cross sectional view in the thickness direction of the configuration example of the imaging device according to the third embodiment of the present disclosure.
Figure 19:
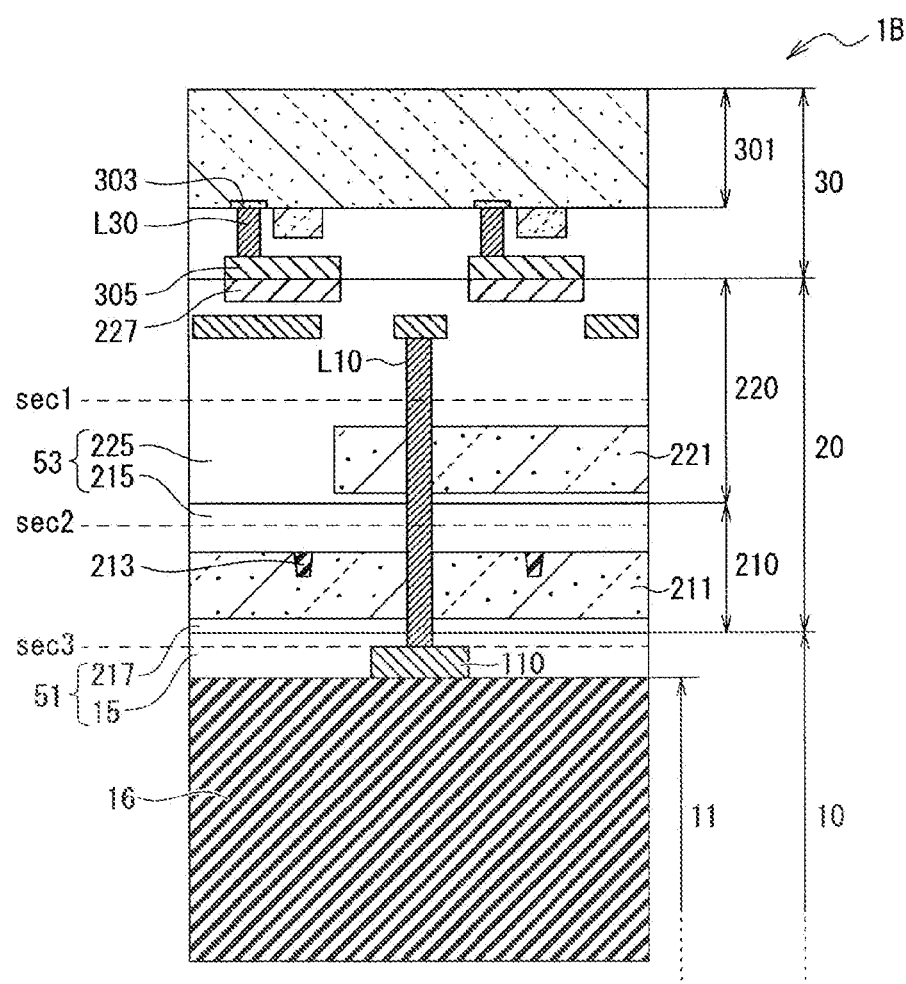
FIG. 19 is a cross sectional view in the thickness direction of the configuration example of the imaging device according to the third embodiment of the present disclosure.
Figure 20:
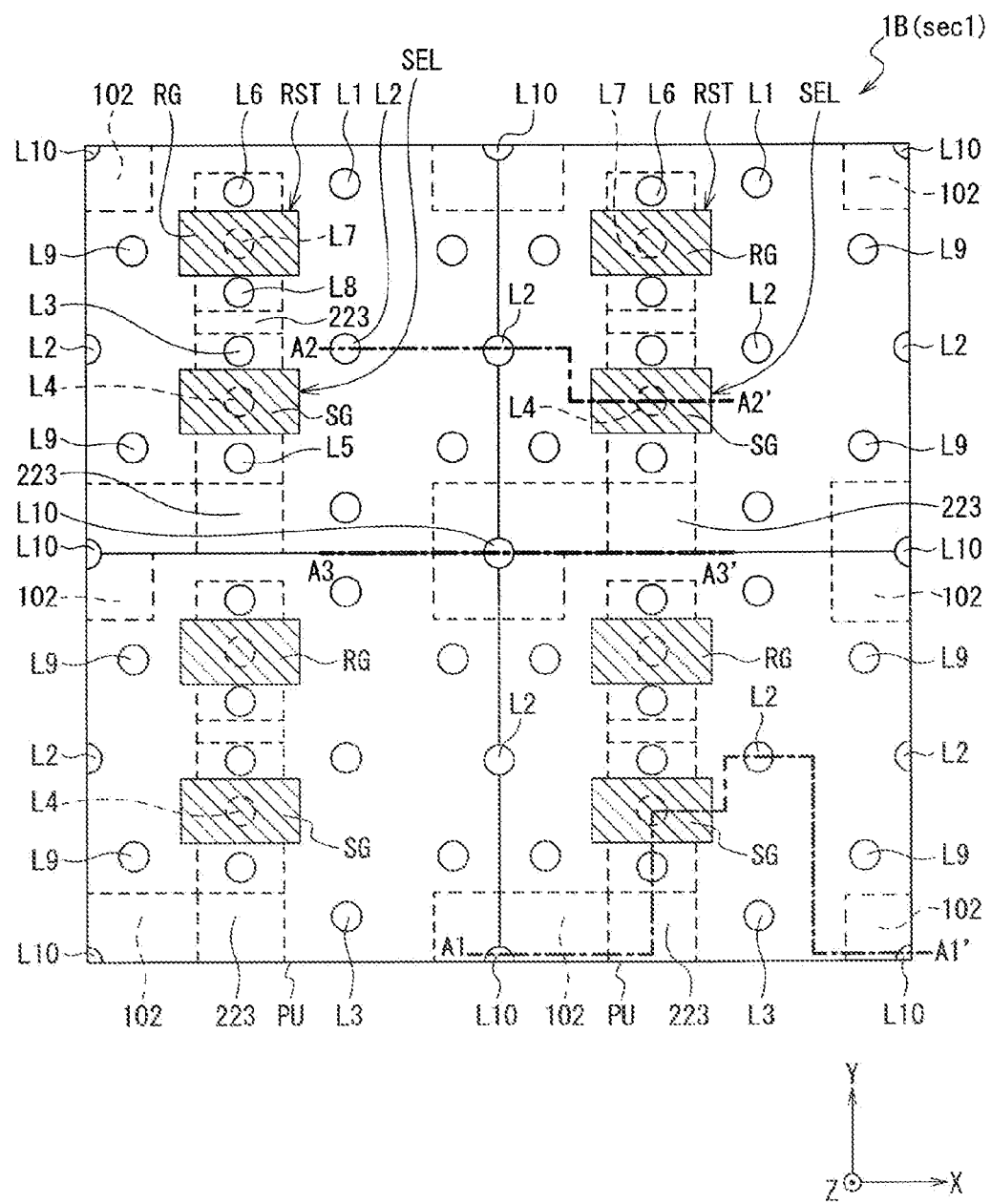
FIG. 20 is a cross sectional view in the horizontal direction of a layout example of a plurality of pixel units according to the third embodiment of the present disclosure.
Figure 21:
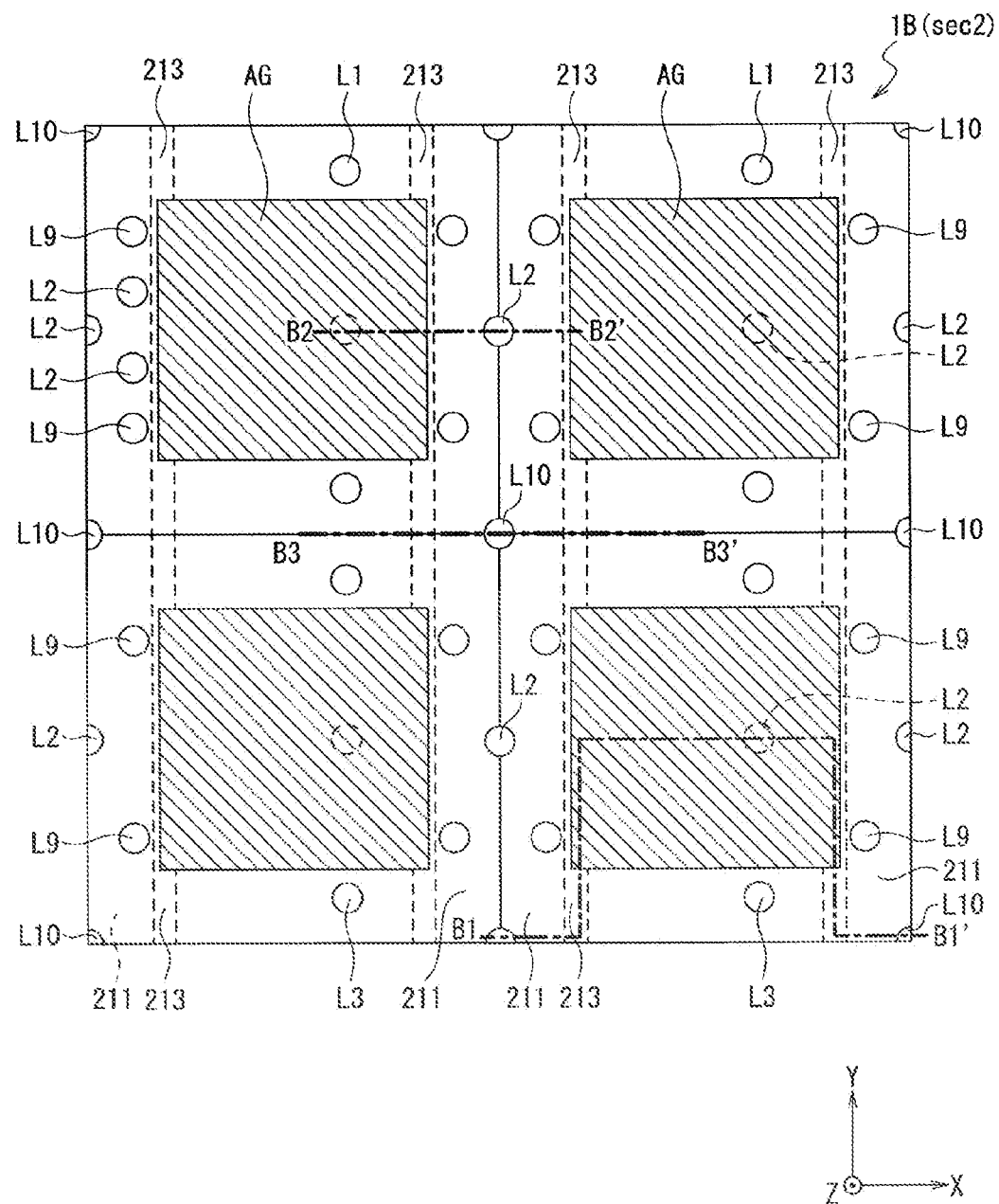
FIG. 21 is a cross sectional view in the horizontal direction of the layout example of the plurality of pixel units according to the third embodiment of the present disclosure.
Figure 22:
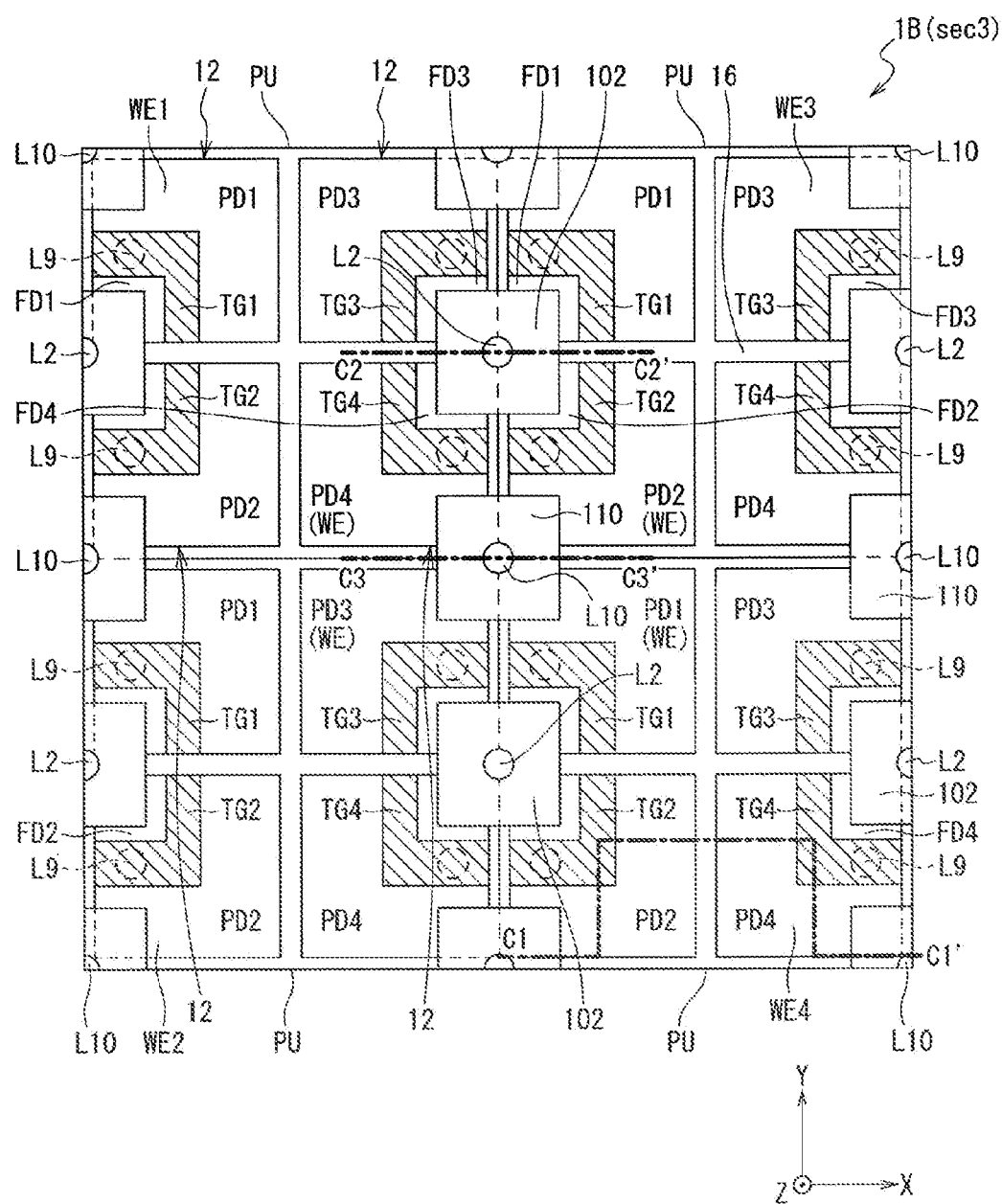
FIG. 22 is a cross sectional view in the horizontal direction of the layout example of the plurality of pixel units according to the third embodiment of the present disclosure.

FIGS. 17 to 19 are cross sectional views in the thickness direction of a configuration example of an imaging device 1B according to a third embodiment of the present disclosure. FIGS. 20 to 22 are cross sectional views in the horizontal direction of a layout example of a plurality of pixel units PU according to the third embodiment of the present disclosure. It is to be noted that the cross sectional views in FIGS. 17 to 19 are schematic and are not intended to strictly depict an actual structure. In the cross sectional views in FIGS. 17 to 19, the positions of the transistors and the impurity diffusion layer in the strict horizontal direction are intentionally varied among the positions sec1 to sec3, for easy-to-understand explanation of the configuration of the imaging device 1B.

Specifically, in the pixel unit PU of the imaging device 1B in FIG. 17, a cross section at the position sec1 corresponds to a cross section taken along A1-A1' line in FIG. 20, a cross section at the position sec2 corresponds to a cross section taken along B1-B1' line in FIG. 21, and a cross section at the position sec3 corresponds to a cross section taken along C1-C1' line in FIG. 22. Similarly, in the imaging device 1B in FIG. 18, a cross section at the position sec1 corresponds to a cross section taken along A2-A2' line in FIG. 20, a cross section at the position sec2 corresponds to a cross section taken along B2-B2' line in FIG. 21, and a cross section at the position sec3 corresponds to a cross section taken along C2-C2' line in FIG. 22. In the imaging device 1B in FIG. 19, a cross section at the position sec1 corresponds to a cross section taken along A3-A3' line in FIG. 20, a cross section at the position sec2 corresponds to a cross section taken along B3-B3' line in FIG. 21, and a cross section at the position sec3 corresponds to a cross section taken along C3-C3' line in FIG. 22.

As depicted in FIGS. 18 and 22, in the imaging device 1B, a common pad electrode 102 (which is one example of a "first common pad electrode" according to the present disclosure) that is disposed over a plurality of sensor pixels 12 and one line L2 disposed on the common pad electrode 102 are shared. For example, the imaging device 1B includes a region where floating diffusions FD1 to FD4 of four sensor pixels 12 are adjacent to one another via the element isolation layer 16 in a plan view. In this region, the common pad electrode 102 is disposed. The common pad electrode 102 is disposed over the four floating diffusions FD1 to FD4 and is electrically connected to each of the four floating diffusions FD1 to FD4. For example, the common pad electrode 102 includes a poly silicon film doped with n-type impurities or p-type impurities.

One line L2 (i.e. floating diffusion contact) is disposed on the center portion of the common pad electrode 102. As depicted in FIGS. 18 and 20 to 22, the line L2 disposed on the center portion of the common pad electrode 102 passes through the lower substrate 210 of the second substrate part 20 from the first substrate part 10 and extends to the upper substrate 220 of the second substrate part 20. Thus, the line L2 is connected to the gate electrode AG of the amplification transistor AMP via a line, etc. disposed on the upper substrate 220.

In addition, in the imaging device 1B, a common pad electrode 110 (which is one example of a "second common pad electrode" according to the present disclosure) that is disposed over a plurality of sensor pixels 12 and one line L10 that is disposed on the common pad electrode 110 are shared, as depicted in FIGS. 17 and 22. For example, the imaging device 1B includes a region where respective well layers WE of four sensor pixels 12 are adjacent to one another via the element isolation layer 16 in a plan view. In this region, the common pad electrode 110 is disposed. The common pad electrode 110 is disposed over the well layers WE of the four sensor pixels 12 and is electrically connected to each of the well layers WE of the four sensor pixels 12. In a certain example, the common pad electrode 110 is disposed between one common pad electrode 102 and another common pad electrode 102 that are disposed side by side in the Y-axis direction. In the Y-axis direction, the common pad electrodes 102 and 110 are alternately arranged. For example, the common pad electrode 110 includes a poly silicon film doped with n-type impurities or p-type impurities.

One line L10 (i.e. well contact) is disposed on the center portion of the common pad electrode 110. As depicted in FIGS. 17 and 19 to 22, the line L10 disposed on the center portion of the common pad electrode 110 passes through the lower substrate 210 of the second substrate part 20 from the first substrate part 10, extends to the upper substrate 220 of the second substrate part 20, and is connected to a reference potential line that supplies a reference potential (e.g. ground potential: 0 V) via a line, etc. disposed on the upper substrate 220.

The line L10 disposed on the center portion of the common pad electrode 110 is electrically connected to an upper surface of the common pad electrode 110, an inner side surface of a through hole disposed in the lower substrate 210, and an inner side surface of a through hole disposed in the upper substrate 220. As a result, the well layers WE in the semiconductor substrate 11 of the first substrate part 10, and the well layer in the lower substrate 210 and the well layer in the upper substrate 220 of the second substrate part 20 are connected to a reference potential (e.g. ground potential: 0 V).

The imaging device 1B according to the third embodiment of the present disclosure provides effects similar to those provided by the imaging device 1 according to the first embodiment. In addition, the imaging device 1B further includes the common pad electrodes 102 and 110 that are disposed on the front surface 11a side of the semiconductor substrate 11 constituting the first substrate part 10 and that are each disposed over a plurality (e.g. four) of adjacent sensor pixels 12. The common pad electrode 102 is electrically connected to the floating diffusions FD of the four sensor pixels 12. The common pad electrode 110 is electrically connected to the well layers WE of the four sensor pixels 12. According to this configuration, the line L2 to be connected to a floating diffusion FD can be shared by every four sensor pixels 12. The common line L10 to be connected to a well layer WE can be shared by every four sensor pixels 12. Accordingly, the number of the lines L2 and L10 can be reduced, so that the area of the sensor pixels 12 can be reduced, and the imaging device 1B can be downsized.

Fourth Embodiment

In the above-mentioned first embodiment, it has been explained that the element isolation layer 16 electrically isolating the adjacent sensor pixels 12 from each other is disposed on the semiconductor substrate 11. In an embodiment of the present disclosure, the element isolation layer 16 may be disposed to be extended from the front surface 11a of the semiconductor substrate 11 toward the rear surface 11b, or may be disposed to be extended from the rear surface 11b toward the front surface 11a. For example, in the structure of the imaging device 1 according to the first embodiment, the element isolation layer 16 is disposed to be extended from the front surface 11a of the semiconductor substrate 11 toward the rear surface 11b. The fourth embodiment exemplifies a structure in which the element isolation layer 16 is disposed to be extended from the rear surface 11b of the semiconductor substrate 11 toward the front surface 11a.

Figure 23:
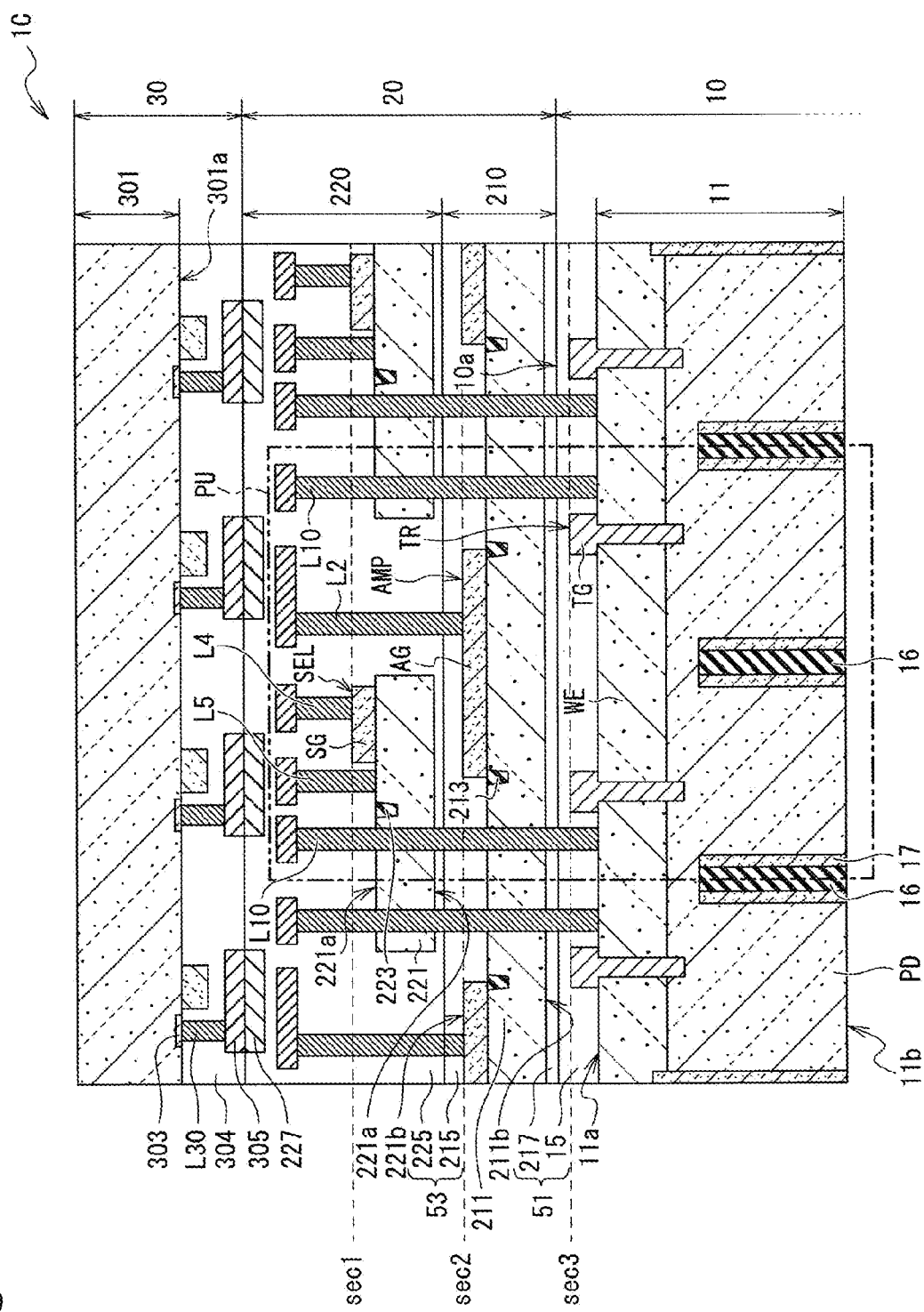
FIG. 23 is a cross sectional view in the thickness direction of a configuration example of an imaging device according to a fourth embodiment of the present disclosure.

FIG. 23 is a cross sectional view in the thickness direction of a configuration example of an imaging device 1C according to the fourth embodiment of the present disclosure. In the imaging device 1C, the element isolation layer 16 is disposed to be extended from the rear surface 11b (i.e. light incident surface) of the semiconductor substrate 11 toward the front surface 11a, as depicted in FIG. 23. For example, the element isolation layer 16 is DTI (Deep Trench Isolation). The element isolation layer 16 is formed by forming a deep trench from the rear surface 11b toward the front surface 11a and embedding an insulation film of silicon oxide or the like in the deep trench. With this configuration, the imaging device 1C can also provide effects similar to those provided by the imaging device 1 according to the first embodiment.

It is to be noted that FIG. 23 depicts the structure in which the element isolation layer 16 is disposed to be extend from the rear surface 11b of the semiconductor substrate 11 to the inside of the semiconductor substrate 11, but this structure is merely one example. In the third embodiment, the element isolation layer 16 may reach the front surface 11a of the semiconductor substrate 11. That is, the element isolation layer 16 may pass through the semiconductor substrate 11.

Other Embodiments

Explanation of the present disclosure has been given so far on the basis of the embodiments and modifications. However, it should not be understood that a description or a drawing included in the present disclosure is provided to delimit the present disclosure. From the present disclosure, various substitutes, embodiments, and operational technologies will be apparent to a person skilled in the art.

For example, in the above-mentioned first embodiment, the amplification transistor AMP is disposed on the first semiconductor substrate 211 while the selection transistor SEL and the reset transistor RST are disposed on the second semiconductor substrate 221. However, the embodiments of the present disclosure are not limited to this. The selection transistor SEL and the reset transistor RST may be disposed on the first semiconductor substrate 211 while the amplification transistor AMP may be disposed on the second semiconductor substrate 221. Alternatively, the amplification transistor AMP and either one of the selection transistor SEL and the reset transistor RST may be disposed on the first semiconductor substrate 211 while the other one of the selection transistor SEL and the reset transistor RST may be disposed on the second semiconductor substrate 221.

In the above-mentioned second embodiment, the amplification transistor AMP is disposed on the first semiconductor substrate 211 while the selection transistor SEL and the reset transistor RST are disposed on the semiconductor film 221A. However, the embodiments of the present disclosure are not limited to this. The selection transistor SEL and the reset transistor RST may be disposed on the first semiconductor substrate 211 while the amplification transistor AMP may be disposed on the semiconductor film 221A. Alternatively, the amplification transistor AMP and either one of the selection transistor SEL and the reset transistor RST may be disposed on the first semiconductor substrate 211 while the other one of the selection transistor SEL and the reset transistor RST may be disposed on the semiconductor film 221A.

As described above, it goes without saying that the present technology encompasses various embodiments and the like that are not described herein. Within the gist of the above-mentioned embodiments and modifications, at least one of omission of a component, replacement of a component, and change of a component can be conducted. In addition, the effects described herein are just examples and are not limitative. Any other effect may be provided.

It is to be noted that the present disclosure can also have the following configurations.

(1)
An imaging device including:
a first substrate part that includes a sensor pixel to perform photoelectric conversion; and
a second substrate part that is disposed on one surface side of the first substrate part and that includes a reading circuit to output a pixel signal based on an electric charge outputted from the sensor pixel, in which
the second substrate part includes
a first semiconductor substrate on which a first transistor included in the reading circuit is disposed, and
a second semiconductor substrate that is disposed on one surface side of the first semiconductor substrate and on which a second transistor included in the reading circuit is disposed.

(2)
An imaging device including:
a first substrate part that includes a sensor pixel to perform photoelectric conversion; and
a second substrate part that is disposed on one surface side of the first substrate part and that includes a reading circuit to output a pixel signal based on an electric charge outputted from the sensor pixel, in which
the second substrate part includes
a first semiconductor substrate on which a first transistor included in the reading circuit is disposed, and
a semiconductor film that is disposed on one surface side of the first semiconductor substrate and on which a second transistor included in the reading circuit is disposed.

(3)
The imaging device according to (1) or (2), in which,
in the thickness direction of the second substrate part, the first transistor overlaps with the second transistor.

(4)
The imaging device according to any one of (1) to (3), in which
the sensor pixel includes
a photoelectric conversion element,
a transfer transistor that is electrically connected to the photoelectric conversion element, and
a floating diffusion that temporarily holds an electric charge outputted from the photoelectric conversion element via the transfer transistor,
the reading circuit includes
a reset transistor that resets a potential of the floating diffusion to a predetermined potential,
an amplification transistor that generates, as the pixel signal, a signal having a voltage according to a level of the electric charge held in the floating diffusion, and
a selection transistor that controls a timing of outputting the pixel signal from the amplification transistor,
the first transistor includes the amplification transistor, and
the second transistors include the reset transistor and the selection transistor.

(5)
The imaging device according to (4), in which
the one reading circuit is electrically connected to a plurality of the sensor pixels, so that one pixel unit is formed, and,
in a plan view from a thickness direction of a layered body including the first substrate part and the second substrate part, the amplification transistor is located in a center portion of the pixel unit.

(6)
The imaging device according to (5), in which
the layered body includes a line group that is electrically connected to the sensor pixel, and,
in the plan view from the thickness direction of the layered body, at least part of the line group is disposed to have bilateral symmetry with the amplification transistor being interposed.

(7)
The imaging device according to any one of (1) to (6), further including:
a third substrate part that is disposed on a side, of the second substrate part, opposite to a surface facing the first substrate part, in which
a logic circuit that processes the pixel signal is disposed on the third substrate part.

(8)
The imaging device according to (7), in which
a silicide is disposed in the third substrate part.

(9)
The imaging device according to any one of (1) to (8), further including:
a first common pad electrode that is disposed on the one surface side of the first substrate part and that is disposed over a plurality of the adjacent sensor pixels, in which
the sensor pixels each include
a photoelectric conversion element, a transfer transistor that is electrically connected to the photoelectric conversion element, and a floating diffusion that temporarily holds an electric charge outputted from the photoelectric conversion element via the transfer transistor, and the first common pad electrode is electrically connected to the floating diffusions of a plurality of the sensor pixels.

(10)

The imaging device according to any one of (1) to (9), further including:

a second common pad electrode that is disposed on the one surface side of the first substrate part and that is disposed over a plurality of the adjacent sensor pixels, in which the sensor pixels each have a well layer, and the second common pad electrode is electrically connected to the well layers of a plurality of the sensor pixels.

(11)

The imaging device according to any one of (1) to (10), further including:

an element isolation layer that is disposed in the first substrate part and that is disposed between a plurality of the adjacent sensor pixels, in which the element isolation layer is disposed to be extended from the one surface of the first substrate part toward the other surface that is located opposite to the one surface.

(12)

The imaging device according to any one of (1) to (10), further including:

an element isolation layer that is disposed in the first substrate part, and that is disposed between a plurality of the adjacent sensor pixels, in which the element isolation layer is disposed to be extended, toward the one surface of the first substrate part, from the other surface that is located opposite to the one surface.

REFERENCE SIGNS LIST 1, 1A, 1B, 1C: Imaging device
3: Column signal processing circuit
10: First substrate part (bottom substrate)
10a, 11a, 12a, 221a, 221a, 221Aa, 227a, 301a: Front surface
11, 301: Semiconductor substrate
12: Sensor pixel
13: Pixel region
15, 215, 217, 225, 225A, 225B, 225C, 304: Insulation film
16, 213, 223: Element isolation layer
17: Impurity diffusion layer
20, 20A: Second substrate part
22: Reading circuit
23: Pixel drive line
24: Vertical signal line
30: Third substrate part
32: Logic circuit
33: Vertical drive circuit
34: Column signal processing circuit
35: Horizontal drive circuit
36: System control circuit
39: Silicide
51, 53: Interlayer insulation film
102, 110: Common pad electrode
210: Lower substrate (middle substrate)
211: First semiconductor substrate
11b, 211b, 221b: Rear surface
220: Upper substrate (top substrate)
221: Second semiconductor substrate
221A: Semiconductor film
227, 305: Pad electrode
AG: Gate electrode
AMP: Amplification transistor
FD: Floating diffusion
L1 to L10, L30: Line
PD: Photodiode
PU: Pixel unit
RG: Gate electrode
RST: Reset transistor
sec1, sec2, sec3: Position
SEL: Selection transistor
SG: Gate electrode
TG: Gate electrode
TR: Transfer transistor
VDD: Power supply line
Vout: Output voltage
WE: Well layer

What is claimed is:

1. An imaging device, comprising:
a first substrate part that includes a sensor pixel to perform photoelectric conversion; and
a second substrate part that is disposed on one surface side of the first substrate part and includes a reading circuit to output a pixel signal based on an electric charge output from the sensor pixel,
wherein the second substrate part includes:
a first semiconductor substrate on which a first transistor included in the reading circuit is disposed; and
a second semiconductor substrate that is disposed on one surface side of the first semiconductor substrate and on which a second transistor included in the reading circuit is disposed,
wherein a layered body including the first substrate part and the second substrate part includes a line group that is electrically connected to the sensor pixel, and
wherein in a plan view from a thickness direction of the layered body, at least part of the line group is disposed to have bilateral symmetry with an amplification transistor being interposed.

2. An imaging device, comprising:
a first substrate part that includes a sensor pixel to perform photoelectric conversion; and
a second substrate part that is disposed on one surface side of the first substrate part and includes a reading circuit to output a pixel signal based on an electric charge output from the sensor pixel,
wherein the second substrate part includes:
a semiconductor substrate on which a first transistor included in the reading circuit is disposed, and
a semiconductor film that is disposed on one surface side of the semiconductor substrate and on which a second transistor included in the reading circuit is disposed,
wherein a layered body including the first substrate part and the second substrate part includes a line group that is electrically connected to the sensor pixel, and
wherein in a plan view from a thickness direction of the layered body, at least part of the line group is disposed to have bilateral symmetry with an amplification transistor being interposed.

3. The imaging device according to claim 1, wherein in a thickness direction of the second substrate part, the first transistor overlaps with the second transistor.

4. The imaging device according to claim 1, wherein the sensor pixel includes:
a photoelectric conversion element;

a transfer transistor that is electrically connected to the photoelectric conversion element; and a floating diffusion that temporarily holds an electric charge outputted from the photoelectric conversion element via the transfer transistor, wherein the reading circuit includes:
a reset transistor that resets a potential of the floating diffusion to a predetermined potential;
the amplification transistor that generates, as the pixel signal, a signal having a voltage according to a level of the electric charge held in the floating diffusion; and
a selection transistor that controls a timing of outputting the pixel signal from the amplification transistor,
wherein the first transistor includes the amplification transistor, and
wherein the second transistors include the reset transistor and the selection transistor.

5. The imaging device according to claim 4, wherein the reading circuit is electrically connected to a plurality of the sensor pixels, so that one pixel unit is formed and in the plan view from the thickness direction of the layered body, the amplification transistor is located in a center portion of the one pixel unit.

6. The imaging device according to claim 1, further comprising:
a third substrate part that is disposed on a side, of the second substrate part, opposite to a surface facing the first substrate part,
wherein a logic circuit that processes the pixel signal is disposed on the third substrate part.

7. The imaging device according to claim 6, wherein a silicide is disposed in the third substrate part.

8. The imaging device according to claim 1, further comprising:
a plurality of sensor pixels; and
a first common pad electrode that is disposed on the one surface side of the first substrate part and that is disposed over a plurality of adjacent sensor pixels of the plurality of sensor pixels,
wherein each of the plurality of sensor pixels includes:
a photoelectric conversion element,
a transfer transistor that is electrically connected to the photoelectric conversion element, and
a floating diffusion that temporarily holds an electric charge outputted from the photoelectric conversion element via the transfer transistor, and
the first common pad electrode is electrically connected to the floating diffusions of the plurality of the sensor pixels.

9. The imaging device according to claim 1, further comprising:
a plurality of sensor pixels; and
a second common pad electrode that is disposed on the one surface side of the first substrate part and that is disposed over a plurality of adjacent sensor pixels of the plurality of sensor pixels,
wherein each of the plurality of sensor pixels has a well layer, and
wherein the second common pad electrode is electrically connected to the well layers of the plurality of the sensor pixels.

10. The imaging device according to claim 1, further comprising:
a plurality of sensor pixels; and an element isolation layer that is disposed in the first substrate part and that is disposed between a plurality of adjacent sensor pixels of the plurality of sensor pixels,
wherein the element isolation layer is disposed to be extended from the one surface of the first substrate part toward another surface that is located opposite to the one surface.

11. The imaging device according to claim 1, further comprising:
a plurality of sensor pixels; and
an element isolation layer that is disposed in the first substrate part and that is disposed between a plurality of adjacent sensor pixels of the plurality of sensor pixels,
wherein the element isolation layer is disposed to be extended, toward the one surface of the first substrate part, from another surface that is located opposite to the one surface.

12. The imaging device according to claim 2, wherein in a thickness direction of the second substrate part, the first transistor overlaps with the second transistor.

13. The imaging device according to claim 2, wherein the sensor pixel includes:
a photoelectric conversion element;
a transfer transistor that is electrically connected to the photoelectric conversion element; and
a floating diffusion that temporarily holds an electric charge outputted from the photoelectric conversion element via the transfer transistor,
wherein the reading circuit includes:
a reset transistor that resets a potential of the floating diffusion to a predetermined potential;
the amplification transistor that generates, as the pixel signal, a signal having a voltage according to a level of the electric charge held in the floating diffusion; and
a selection transistor that controls a timing of outputting the pixel signal from the amplification transistor,
wherein the first transistor includes the amplification transistor, and
wherein the second transistors include the reset transistor and the selection transistor.

14. The imaging device according to claim 13, wherein the reading circuit is electrically connected to a plurality of the sensor pixels, so that one pixel unit is formed, and
in the plan view from the thickness direction of the layered body, the amplification transistor is located in a center portion of the one pixel unit.

15. The imaging device according to claim 2, further comprising:
a third substrate part that is disposed on a side, of the second substrate part, opposite to a surface facing the first substrate part,
wherein a logic circuit that processes the pixel signal is disposed on the third substrate part.

16. The imaging device according to claim 15, wherein a silicide is disposed in the third substrate part.

17. The imaging device according to claim 2, further comprising:
a plurality of sensor pixels; and
a first common pad electrode that is disposed on the one surface side of the first substrate part and that is disposed over a plurality of adjacent sensor pixels of the plurality of sensor pixels, wherein each of the plurality of sensor pixels includes:
- a photoelectric conversion element,
- a transfer transistor that is electrically connected to the photoelectric conversion element, and
- a floating diffusion that temporarily holds an electric charge outputted from the photoelectric conversion element via the transfer transistor, and
- the first common pad electrode is electrically connected to the floating diffusions of the plurality of the sensor pixels.

18. The imaging device according to claim 2, further comprising:
- a plurality of sensor pixels; and
- a second common pad electrode that is disposed on the one surface side of the first substrate part and that is disposed over a plurality of adjacent sensor pixels of the plurality of sensor pixels,
- wherein each of the plurality of sensor pixels has a well layer, and
- wherein the second common pad electrode is electrically connected to the well layers of the plurality of the sensor pixels.

19. The imaging device according to claim 2, further comprising:
- a plurality of sensor pixels; and
- an element isolation layer that is disposed in the first substrate part and that is disposed between a plurality of adjacent sensor pixels of the plurality of sensor pixels,
- wherein the element isolation layer is disposed to be extended from the one surface of the first substrate part toward another surface that is located opposite to the one surface.

20. The imaging device according to claim 2, further comprising:
- a plurality of sensor pixels; and
- an element isolation layer that is disposed in the first substrate part and that is disposed between a plurality of adjacent sensor pixels of the plurality of sensor pixels,
- wherein the element isolation layer is disposed to be extended, toward the one surface of the first substrate part, from another surface that is located opposite to the one surface.

\* \* \* \* \*